(12) United States Patent
Chen

(10) Patent No.: US 11,538,785 B2
(45) Date of Patent: Dec. 27, 2022

(54) METHOD OF USING OPTOELECTRONIC SEMICONDUCTOR STAMP TO MANUFACTURE OPTOELECTRONIC SEMICONDUCTOR DEVICE

(71) Applicant: Ultra Display Technology Corp., Taipei (TW)

(72) Inventor: Hsien-Te Chen, Taipei (TW)

(73) Assignee: ULTRA DISPLAY TECHNOLOGY CORP., Taipei (TW)

( * ) Notice: Subject to any disclaimer, the term of this patent is extended or adjusted under 35 U.S.C. 154(b) by 0 days.

(21) Appl. No.: 17/131,092

(22) Filed: Dec. 22, 2020

(65) Prior Publication Data

US 2021/0111148 A1   Apr. 15, 2021

Related U.S. Application Data

(63) Continuation-in-part of application No. 16/224,277, filed on Dec. 18, 2018, now abandoned.

(Continued)

(51) Int. Cl.
*H01L 23/00* (2006.01)

(52) U.S. Cl.
CPC .... *H01L 24/81* (2013.01); *H01L 2224/81005* (2013.01); *H01L 2224/8112* (2013.01);
(Continued)

(58) Field of Classification Search
None
See application file for complete search history.

(56) References Cited

U.S. PATENT DOCUMENTS 9,983,164 B1 * 5/2018 Allen ................. G01N 27/4045
10,872,801 B2 * 12/2020 Chen .................... H01L 25/0753
(Continued)

FOREIGN PATENT DOCUMENTS

EP         1387397 A2 *  2/2004  ....... H01L 27/14627
JP      2002343944 A  * 11/2002
(Continued)

OTHER PUBLICATIONS

Third Office Action form CN 201811477304, 6 pages. (Year: 2021).*

(Continued)

*Primary Examiner* — Telly D Green
(74) *Attorney, Agent, or Firm* — Muncy, Geissler, Olds & Lowe, P.C.

(57) ABSTRACT

A method of using an optoelectronic semiconductor stamp to manufacture an optoelectronic semiconductor device comprises the following steps: a preparation step: preparing at least one optoelectronic semiconductor stamp group and a target substrate, wherein each optoelectronic semiconductor stamp group comprises at least one optoelectronic semiconductor stamp, each optoelectronic semiconductor stamp comprises a plurality of optoelectronic semiconductor components disposed on a heat conductive substrate, each optoelectronic semiconductor component has at least one electrode, and the target substrate has a plurality of conductive portions; an align-press step: aligning and attaching at least one optoelectronic semiconductor stamp to the target substrate, so that the electrodes are pressed on the corresponding conductive portions; and a bonding step: electrically connecting the electrodes to the corresponding conductive portions.

15 Claims, 14 Drawing Sheets

Related U.S. Application Data

(60) Provisional application No. 62/607,520, filed on Dec. 19, 2017.

(52) U.S. Cl.
CPC ............... *H01L 2224/81203* (2013.01); *H01L 2224/81224* (2013.01); *H01L 2224/81805* (2013.01)

(56) References Cited

U.S. PATENT DOCUMENTS

| | | | |
|---|---|---|---|
| 2004/0077121 A1* | 4/2004 | Maeda | H01L 27/148 438/75 |
| 2018/0053742 A1* | 2/2018 | Ting | H01L 33/62 |
| 2019/0074206 A1* | 3/2019 | Chen | H01L 25/0753 |

FOREIGN PATENT DOCUMENTS

| | | | | | |
|---|---|---|---|---|---|
| JP | 2003077984 A | * | 3/2003 | ............. | H01L 24/82 |
| JP | 2005056999 A | * | 3/2005 | ....... | H01L 27/14625 |
| KR | 20170079930 A | * | 7/2017 | | |

OTHER PUBLICATIONS

Office Action of CN Application No. 201811477304.1, dated Dec. 3, 2019, 7 pages.
Office Action of CN Application No. 201811477304.1, dated Aug. 20, 2020, 7 pages.

\* cited by examiner providing an optoelectronic semiconductor substrate, wherein the optoelectronic semiconductor substrate comprises a plurality of optoelectronic semiconductor components separately disposed on an epitaxial substrate, and each of the optoelectronic semiconductor components comprises at least an electrode ~S01 pressing the optoelectronic semiconductor substrate to an UV tape, wherein the electrodes of the optoelectronic semiconductor components are adhered to the UV tape ~S02 removing the epitaxial substrate, wherein at least a part of the optoelectronic semiconductor components are adhered to the UV tape ~S03 decreasing adhesion of at least a part of the UV tape ~S04 picking up at least a part of the optoelectronic semiconductor components corresponding to the part of the UV tape with reduced adhesion by a heat conductive substrate, wherein the part of the optoelectronic semiconductor components corresponding to the part of the UV tape with reduced adhesion is removed from the UV tape so as to obtain the optoelectronic semiconductor stamp, the heat conductive substrate comprises a buffer layer disposed on a heat conductive base, and the buffer layer adheres the optoelectronic semiconductor components corresponding to the part of the UV tape with reduced adhesion ~S05

FIG. 1

METHOD OF USING OPTOELECTRONIC SEMICONDUCTOR STAMP TO MANUFACTURE OPTOELECTRONIC SEMICONDUCTOR DEVICE

CROSS REFERENCE TO RELATED APPLICATIONS

This application is a Continuation-In-Part (CIP) of an earlier filed, application, having application Ser. No. 16/224,277 and filed on Dec. 18, 2018, which claimed priority to U.S. provisional patent application with Ser. No. 62/607,520 filed on Dec. 19, 2017. This and all other extrinsic materials discussed herein are incorporated by reference in their entirety.

BACKGROUND

Technology Field

The present disclosure relates to a semiconductor stamp and, in particular, to an optoelectronic semiconductor stamp and manufacturing method thereof, and an optoelectronic semiconductor device made by the optoelectronic semiconductor stamp.

Description of Related Art

Compared with the conventional LCD device, the LED array device made of LEDs (e.g. LED display device), the Mini LED array device made of Mini LEDs (e.g. Mini LED display device), or the Micro LED array device made of Micro LEDs (e.g. Micro LED display device) does not need additional backlight source, so they can be manufactured with a lighter weight and a thinner shape.

In the conventional manufacturing process of optoelectronic device containing LED (e.g. display device), the LEDs are usually manufactured in advance by epitaxy process, and then the half-cut process (electrical isolation), point measurement process, and full-cut process are performed to obtain individual LEDs. Next, the individual LEDs are transferred to a supporting substrate. Afterwards, the pick-up head is provided to pick up one or more LEDs from the supporting substrate and then transfer the picked LEDs to, for example, a matrix circuit substrate for the following processes.

However, the conventional manufacturing method of transferring the LED dies one by one needs relatively higher apparatus accuracy and cost, and the manufacturing processes are complex and difficult. Thus, it is hard to carry out the goal of batch transferring, and the manufacturing time and cost of optoelectronic device are relatively higher.

SUMMARY

An objective of this disclosure is to provide a method of using optoelectronic semiconductor stamps to manufacture an optoelectronic semiconductor device. Compared with the conventional manufacturing method, the method of this disclosure has the advantages of simple processes and short manufacturing time. Besides, this disclosure can achieve the goal of batch transferring, so that the optoelectronic semiconductor device can have shorter manufacturing time and lower cost.

This disclosure provides a method of using an optoelectronic semiconductor stamp to manufacture an optoelectronic semiconductor device, comprising steps of: a preparation step: preparing at least one optoelectronic semiconductor stamp group and a target substrate, wherein each of the optoelectronic semiconductor stamp groups comprises at least one optoelectronic semiconductor stamp, each of the optoelectronic semiconductor stamps comprises a plurality of optoelectronic semiconductor components disposed on a heat conductive substrate, each of the optoelectronic semiconductor components has at least one electrode, and the target substrate has a plurality of conductive portions; an align-press step: aligning and attaching at least one of the optoelectronic semiconductor stamps to the target substrate, so that the electrodes are pressed on the corresponding conductive portions; and a bonding step: electrically connecting the electrodes to the corresponding conductive portions.

In one embodiment, the method further comprises a step of: a repeat step: repeating the align-press step and the bonding step.

In one embodiment, in the repeating step, a covering range of the subsequently used optoelectronic semiconductor stamp aligned and pressed on the target substrate at least partially comprises a covering range of the previously used optoelectronic semiconductor stamp aligned and pressed on the target substrate.

In one embodiment, in the repeating step, a covering range of the subsequently used optoelectronic semiconductor stamp aligned and pressed on the target substrate excludes a covering range of the previously used optoelectronic semiconductor stamp aligned and pressed on the target substrate.

In one embodiment, a covering range of the optoelectronic semiconductor stamp aligned and pressed on the target substrate is a polygon, a circle, or an oval.

In one embodiment, each of the optoelectronic semiconductor stamp groups comprises a plurality of optoelectronic semiconductor stamps, and the optoelectronic semiconductor components in the different optoelectronic semiconductor stamps of one of the optoelectronic semiconductor stamp groups are arranged at the same positions on the heat conductive substrate.

In one embodiment, the bonding step is performed by eutectic bonding, laser bonding, or ACF bonding.

In one embodiment, the eutectic bonding comprises following steps of: a heating step: heating the heat conductive substrate for transmitting heat to the electrodes; a bonding step: utilizing the heat transmitted to the electrodes to eutectic bond the electrodes to the corresponding conductive portions, thereby electrically connecting the electrodes to the corresponding conductive portions; and a removal step: removing the heat conductive substrate.

In one embodiment, before the align-press step, an ACF (anisotropic conductive film) is disposed on the conductive portions, so that the ACF is located between the electrodes and the corresponding conductive portions, and the method of ACF bonding comprises steps of: a heating step: heating the heat conductive substrate for transmitting heat to the electrodes; a bonding step: utilizing the heat transmitted to the electrodes to bond the electrodes to the corresponding conductive portions through the ACF, thereby electrically connecting the electrodes to the corresponding conductive portions; and a removal step: removing the heat conductive substrate.

In one embodiment, before the align-press step, an ACF is disposed on the conductive portions, so that the ACF is located between the electrodes and the corresponding conductive portions, and the method of ACF bonding comprises steps of: a removal step: removing the heat conductive substrate, so that the optoelectronic semiconductor components are adhered to the ACF; a heat-press step: heating and pressing the optoelectronic semiconductor components; and a bonding step: utilizing the heat transmitted to the electrodes to bond the electrodes to the corresponding conductive portions through the ACF, thereby electrically connecting the electrodes to the corresponding conductive portions.

In one embodiment, the laser bonding comprises steps of: an irradiating step: providing a laser to irradiate a press interface between the electrode and the corresponding conductive portion from one side of the target substrate away from the optoelectronic semiconductor stamp; a bonding step: utilizing energy of the laser to melt and bond the electrodes to the corresponding conductive portions, thereby electrically connecting the electrodes to the corresponding conductive portions; and a removal step: removing the heat conductive substrate.

In one embodiment, the optoelectronic semiconductor components on the heat conductive substrate are arranged in a polygon.

In one embodiment, the heat conductive substrate comprises a heat conductive base and a buffer layer, and the buffer layer is disposed on the heat conductive base.

In one embodiment, the optoelectronic semiconductor components are adhered to the heat conductive base through the buffer layer, and the optoelectronic semiconductor components are separately disposed on the heat conductive substrate.

In one embodiment, a thermal conductivity of the heat conductive substrate or the heat conductive base is greater than 1 W/mK.

In one embodiment, the optoelectronic semiconductor device is a LED display device, a light sensing device, or a laser array.

As mentioned above, in this disclosure, the method of using an optoelectronic semiconductor stamp to manufacture an optoelectronic semiconductor device comprises steps of: preparing at least one optoelectronic semiconductor stamp group and a target substrate, wherein each of the optoelectronic semiconductor stamp group comprises at least one optoelectronic semiconductor stamp, each of the optoelectronic semiconductor stamp comprises a plurality of optoelectronic semiconductor components disposed on a heat conductive substrate, each of the optoelectronic semiconductor components has at least one electrode, and the target substrate has a plurality of conductive portions; performing an align-press step for aligning and attaching at least one of the optoelectronic semiconductor stamps to the target substrate, so that the electrodes are pressed on the corresponding conductive portions; and performing a bonding step: electrically connecting the electrodes to the corresponding conductive portions. Compared with the conventional manufacturing processes of optoelectronic device made of LEDs, which is to perform the epitaxial process, the photolithograph process, and the cutting processes (including half-cut, point measurement and full-cut processes) to obtain the individual optoelectronic semiconductor components, this disclosure does not need to transfer the optoelectronic semiconductor components to the target substrate one by one. As a result, this disclosure has the advantages of simple processes and short manufacturing time. Besides, this disclosure can achieve the goal of batch transferring, so that the optoelectronic semiconductor device can have shorter manufacturing time and lower cost.

BRIEF DESCRIPTION OF THE DRAWINGS

The disclosure will become more fully understood from the detailed description and accompanying drawings, which are given for illustration only, and thus are not limitative of the present disclosure, and wherein:

FIG. 1 is a flow chart showing a manufacturing method of an optoelectronic semiconductor stamp according to an embodiment of this disclosure;

DETAILED DESCRIPTION OF THE DISCLOSURE

The present disclosure will be apparent from the following detailed description, which proceeds with reference to the accompanying drawings, wherein the same references relate to the same elements. The figures of all embodiments of the disclosure are merely illustrative and do not represent true dimensions, proportions or quantities. In addition, the orientations "upper" and "lower" as used in the following embodiments are merely used to indicate relative positional relationships. Furthermore, when defining that a component is "on," "above," "below," or "under" another component, it can be realized that the two components are directly contacted with each other, or that the two components are not directly contacted with each other and an additional component is disposed between the two components.

FIG. 1 is a flow chart showing a manufacturing method of an optoelectronic semiconductor stamp according to an embodiment of this disclosure. The optoelectronic semiconductor stamp made by the manufacturing method of this disclosure can be used to fabricate, for example but not limited to, display devices, advertising billboards, sensing devices, laser arrays, light-emitting devices or illumination devices, or other types or functions of optoelectronic semiconductor devices.

The manufacturing method of an optoelectronic semiconductor stamp of this disclosure comprises steps of: providing an optoelectronic semiconductor substrate, wherein the optoelectronic semiconductor substrate comprises a plurality of optoelectronic semiconductor components separately disposed on an epitaxial substrate, and each of the optoelectronic semiconductor components comprises at least an electrode (step S01); pressing the optoelectronic semiconductor substrate to an UV tape, wherein the electrodes of the optoelectronic semiconductor components are adhered to the UV tape (step S02); removing the epitaxial substrate, wherein at least a part of the optoelectronic semiconductor components are adhered to the UV tape (step S03); decreasing adhesion of at least a part of the UV tape (step S04); and picking up at least a part of the optoelectronic semiconductor components corresponding to the part of the UV tape with reduced adhesion by a heat conductive substrate, wherein the part of the optoelectronic semiconductor components corresponding to the part of the UV tape with reduced adhesion is removed from the UV tape so as to obtain the optoelectronic semiconductor stamp, the heat conductive substrate comprises a buffer layer disposed on a heat conductive base, and the buffer layer adheres the optoelectronic semiconductor components corresponding to the part of the UV tape with reduced adhesion (step S05).

The detailed descriptions of the above steps will be illustrated hereinafter with reference to FIGS. 2A to 2F. FIGS. 2A to 2F are schematic diagrams showing the manufacturing procedures of an optoelectronic semiconductor stamp according to a first embodiment of this disclosure.

Figure 2A:
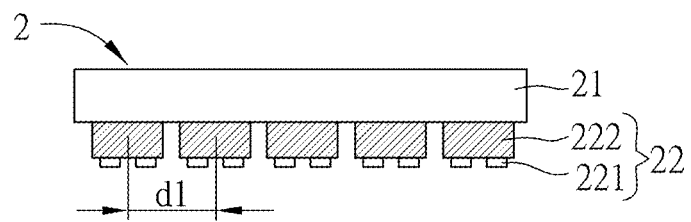
FIGS. 2A to 2F are schematic diagrams showing the manufacturing procedures of an optoelectronic semiconductor stamp according to a first embodiment of this disclosure.

As shown in FIG. 1, the step S01 is to providing an optoelectronic semiconductor substrate. Referring to FIG. 2A, the optoelectronic semiconductor substrate 2 comprises an epitaxial substrate 21 and a plurality of optoelectronic semiconductor components 22. The optoelectronic semiconductor components 22 are separately disposed on the epitaxial substrate 21, and each of the optoelectronic semiconductor components 22 comprises at least an electrode 221. As shown in FIG. 2A, the optoelectronic semiconductor substrate 2 is reversed, which means that the epitaxial substrate 21 is disposed on the top and the electrode 221 faces downwardly. In this embodiment, each optoelectronic semiconductor component 22 comprises two electrodes 221 and one main body 222, and the main body 222 is disposed on the epitaxial substrate 21. The electrodes 221 are disposed on the surface of the main body 222 away from the epitaxial substrate 21. In this case, the optoelectronic semiconductor component 22 comprises flip-chip type electrodes or horizontal type electrodes. In other embodiments, the optoelectronic semiconductor component 22 may comprise vertical type electrodes, and this disclosure is not limited.

In some embodiments, the epitaxial substrate 21 can be a wafer plate, and can be made of transparent or opaque material, such as sapphire substrate, GaAs substrate or SiC substrate. In addition, the optoelectronic semiconductor components 22 can be arranged in an array (e.g. 2D array) and separately disposed on the epitaxial substrate 21. Alternatively, the optoelectronic semiconductor components 22 can be alternately arranged and separately disposed on the epitaxial substrate 21. This disclosure is not limited. Preferably, the optoelectronic semiconductor components 22 are arranged in a 2D array.

In this embodiment, the epitaxial substrate 21 is transparent sapphire substrate, and the material of the optoelectronic semiconductor components 22 is, for example but not limited to, GaN. In other embodiments, the material of the optoelectronic semiconductor components 22 can be other materials, such as AlGaAs, GaP, GaAsP, AlGaInP, or GaN. In addition, the optoelectronic semiconductor component 22 of this embodiment can be a blue LED chip, a green LED chip, a UV light LED chip, a laser LED chip, or a sensing chip (e.g. X-ray sensing chip). To be noted, the above-mentioned LED chip comprises a Mini LED chip or a Micro LED chip, and this disclosure is not limited. In general, the pitch of the optoelectronic semiconductor components 22 on the epitaxial substrate 21 is smaller. In this embodiment, a first pitch d1 is defined between adjacent two of the optoelectronic semiconductor components 22 on the optoelectronic semiconductor substrate 2. In some embodiments, the first pitch d1 is, for example but not limited to, 20 μm.

Figure 2B:
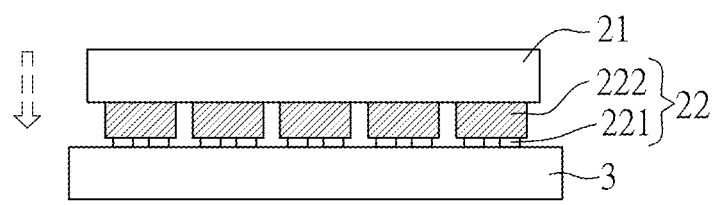
Figure 2C:
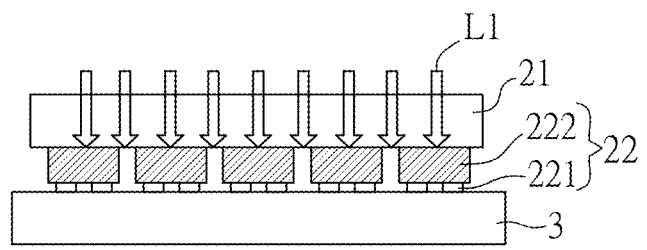
Figure 2D:
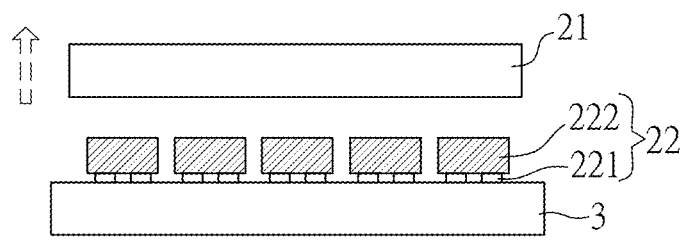

As shown in FIG. 2B, the step S02 is to press the optoelectronic semiconductor substrate 2 to an UV tape 3, wherein the electrodes 221 of the optoelectronic semiconductor components 22 are adhered to the UV tape 3. In this embodiment, the electrodes 221 face downwardly and are pressed on the UV tape 3, so that the UV tape 3 is adhered to the electrodes 221 of the optoelectronic semiconductor components 22.

Next, the step S03 is to remove the epitaxial substrate 21, wherein at least a part of the optoelectronic semiconductor components 22 are adhered to the UV tape 3. In this embodiment, before the step 03 of removing the epitaxial substrate 21, another step is needed to provide a light to irradiate a connection junction between the epitaxial substrate 21 and at least a part of the optoelectronic semiconductor components 22 (see FIG. 2C). Specifically, in order to remove the epitaxial substrate 21 and remain at least a part of the optoelectronic semiconductor components 22 on the UV tape 3, this embodiment is to provide a light to irradiate the connection junction between the epitaxial substrate 21 and all of the optoelectronic semiconductor components 22, thereby decreasing the adhesion between the epitaxial substrate 21 and all of the optoelectronic semiconductor components 22. For example, a laser (light L1) is inputted from one side of the optoelectronic semiconductor substrate 2 away from the UV tape 3 (upper side of the optoelectronic semiconductor substrate 2) to irradiate the connection junction between the epitaxial substrate 21 and all of the optoelectronic semiconductor components 22. The laser can provide energy to decompose the buffer layer (made of GaN) located at the connection junction between the material (GaN) of the optoelectronic semiconductor components 22 and the epitaxial substrate 21 (sapphire substrate), so that the optoelectronic semiconductor components 22 can be easily peeled off from the epitaxial substrate 21. In this embodiment, the non-selective laser lift off (LLO) technology is used to destroy the GaN buffer layer located at the connection junction of all optoelectronic semiconductor components 22, thereby decreasing the adhesion of all optoelectronic semiconductor components 22. As a result, the optoelectronic semiconductor components 22 can be easily peeled off from the epitaxial substrate 21.

After the step of providing a light to irradiate the connection junction between the epitaxial substrate 21 and all of the optoelectronic semiconductor components 22, since the GaN buffer layer located at the connection junction has been destroyed, all optoelectronic semiconductor components 22 can be remained (adhered) on the UV tape 3 (see FIG. 2D) after the following step S03 of removing the epitaxial substrate 21.

Figure 2E:
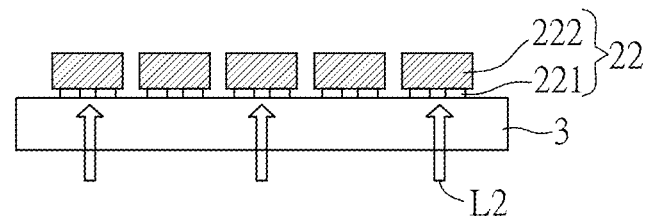

Next, the adhesion of at least a part of the UV tape 3 is decreased (step S04). As shown in FIG. 2E, the UV light (light L2) is provided to selectively irradiate a part of the UV tape 3 for curing the part of adhesive glue within the irradiated part, thereby selectively decreasing the adhesion of the UV tape 3. In this embodiment, the UV light is provided from one side of the UV tape 3 away from the optoelectronic semiconductor components 22 (the lower side of the UV tape 3) to irradiate alternate optoelectronic semiconductor components 22, thereby selectively curing a part of the adhesive glue of the UV tape 3. Since the part of adhesive glue irradiated by the UV light is cured and solidified, the adhesion between the optoelectronic semiconductor components 22 and the adhesive glue within the irradiated part can be decreased. As shown in FIG. 2E, the optoelectronic semiconductor components 22 corresponding to the irradiated part of the UV tape 3 are defined as one group. After repeating several times of step S04, a plurality of groups of optoelectronic semiconductor components 22 with decreased adhesion to the UV tape 3 can be provided for the following transferring process. Of course, it is also possible to provide all optoelectronic semiconductor components 22 with decreased adhesion to the UV tape 3 in one irradiation process (non-selective curing), and this disclosure is not limited.

Figure 2F:
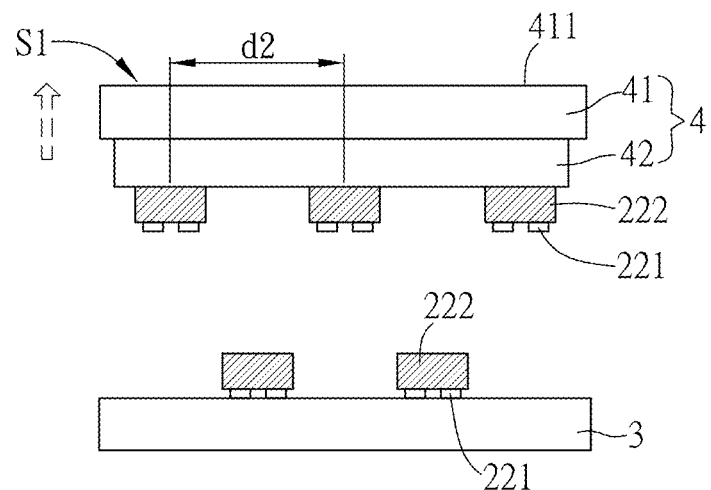

Afterwards, as shown in FIG. 2F, the step S05 is performed to pick up at least a part of the optoelectronic semiconductor components 22 corresponding to the part of the UV tape 3 with reduced adhesion by a heat conductive substrate 4, wherein the part of the optoelectronic semiconductor components 22 corresponding to the part of the UV tape 3 with reduced adhesion is removed from the UV tape 3 so as to obtain the optoelectronic semiconductor stamp S1. The heat conductive substrate 4 comprises a buffer layer 42 disposed on a heat conductive base 41, and, in the step S05 of picking up the optoelectronic semiconductor components 22 corresponding to the part of the UV tape 3 with reduced adhesion, the buffer layer 42 of the heat conductive substrate 4 presses and adheres the optoelectronic semiconductor components 22. The material of the heat conductive base 41 comprises glass, metal, alloy, ceramics, or semiconductor material. The buffer layer 42 can have adhesion and be patterned or non-patterned. The adhesive material of the buffer layer 42 can be polydimethylsiloxane (PDMS), silica gel, thermal tape, or epoxy. The thickness of the buffer layer 42 can be, for example, less than 25 µm. Excepting the adhesion, the buffer layer 42 can also provide elasticity, so that the requirement for planar degree of the contact surface of the optoelectronic semiconductor components 22 and the target substrate of the following transferring process is not so critical.

In this embodiment, since the adhesion between the buffer layer 42 and a part of the optoelectronic semiconductor components 22 is greater than the adhesion between the optoelectronic semiconductor components 22 and the UV tape 3 (result of step S04), at least a part of the optoelectronic semiconductor components 22 corresponding to the part of the UV tape 3 with reduced adhesion can be departed from the UV tape 3 and picked up by the heat conductive substrate 4 after the heat conductive substrate 4 is removed from the UV tape 3. To be noted, the part of the optoelectronic semiconductor components 22 to be picked up by the heat conductive substrate 4 can be a part of the optoelectronic semiconductor components 22 corresponding to the part of the UV tape 3 with reduced adhesion or all of the optoelectronic semiconductor components 22 corresponding to the part of the UV tape 3 with reduced adhesion. The non-picked optoelectronic semiconductor components 22 can be remained on the UV tape 3. Accordingly, the optoelectronic semiconductor stamp S1 containing a plurality of optoelectronic semiconductor components 22 can be obtained.

As shown in FIG. 2F, the optoelectronic semiconductor stamp S1 of this embodiment can be manufactured by transferring at least a part of the optoelectronic semiconductor components 22 on the optoelectronic semiconductor substrate 2. In this embodiment, the optoelectronic semiconductor stamp S1 comprises a heat conductive substrate 4 and a plurality of optoelectronic semiconductor components 22 (which can be at least a part of the optoelectronic semiconductor components 22 on the optoelectronic semiconductor substrate 2) disposed on the heat conductive substrate 4. The optoelectronic semiconductor components 22 are indirectly disposed on the heat conductive substrate 4 via the adhesive function of the buffer layer 42.

In the optoelectronic semiconductor substrate 2, a first pitch d1 is defined between adjacent two of the optoelectronic semiconductor components 22 (FIG. 2A), and a second pitch d2 is defined between adjacent two of optoelectronic semiconductor components 22 of the optoelectronic semiconductor stamp S1 (FIG. 2F). The second pitch d2 is greater than or equal to the first pitch d1. The second pitch d2 is n times of the first pitch d1, and n is an integer greater than or equal to 1. In this embodiment, n is 2. To be noted, the term "pitch" is defined as the distance between the centers (or the left sides or the right sides) of two adjacent optoelectronic semiconductor components 22. In this embodiment, the second pitch d2 is twice of the first pitch d1 (n=2). Of course, in other embodiments, the second pitch d2 can also be 1 time, 3 times, 4 times, 5 times or more of the first pitch d1, and this can be determined based on the design requirement of the optoelectronic semiconductor device.

In addition, in the optoelectronic semiconductor stamp S1 of FIG. 2F, the surface of the buffer layer 42 of the heat conductive substrate 4 adhered to the optoelectronic semiconductor components 22 is a planar surface without pattern. In other embodiments, the surface of the buffer layer 42 adhered to the optoelectronic semiconductor components 22 can be a surface with a non-planar pattern.

Figure 2G:
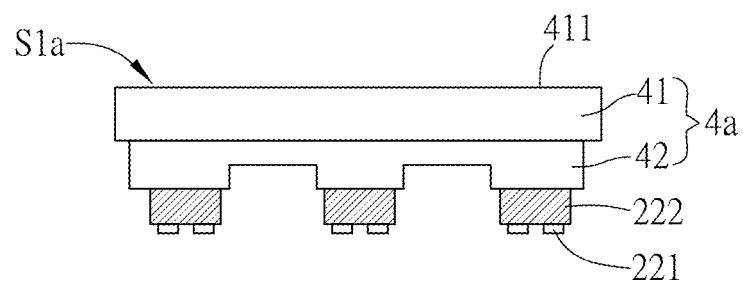
FIG. 2G is a schematic diagram showing another optoelectronic semiconductor stamp according to the embodiment of this disclosure.

FIG. 2G is a schematic diagram showing another optoelectronic semiconductor stamp according to the embodiment of this disclosure. In the optoelectronic semiconductor stamp S1a of FIG. 2G, the buffer layer 42 of the heat conductive substrate 4a is configured with a pattern. In the heat conductive substrate 4a, the parts of the buffer layer 42 for adhering the optoelectronic semiconductor components 22 have a thicker thickness (protrusion), and the parts of the buffer layer 42, which do not adhere the optoelectronic semiconductor components 22, have a thinner thickness. In the step S05, the heat conductive substrate 4a can pick up at least a part of the optoelectronic semiconductor components 22 corresponding to the part of the UV tape 3 with reduced adhesion, so that the optoelectronic semiconductor components 22 corresponding to the part of the UV tape 3 with reduced adhesion can be departed from the UV tape 3 so as to obtain the optoelectronic semiconductor stamp S1a.

At least one of the optoelectronic semiconductor stamp S1 (or S1a, or any modified aspect thereof) made by the above-mentioned method can be used to manufacturing an optoelectronic semiconductor device of this disclosure.

Figure 3:
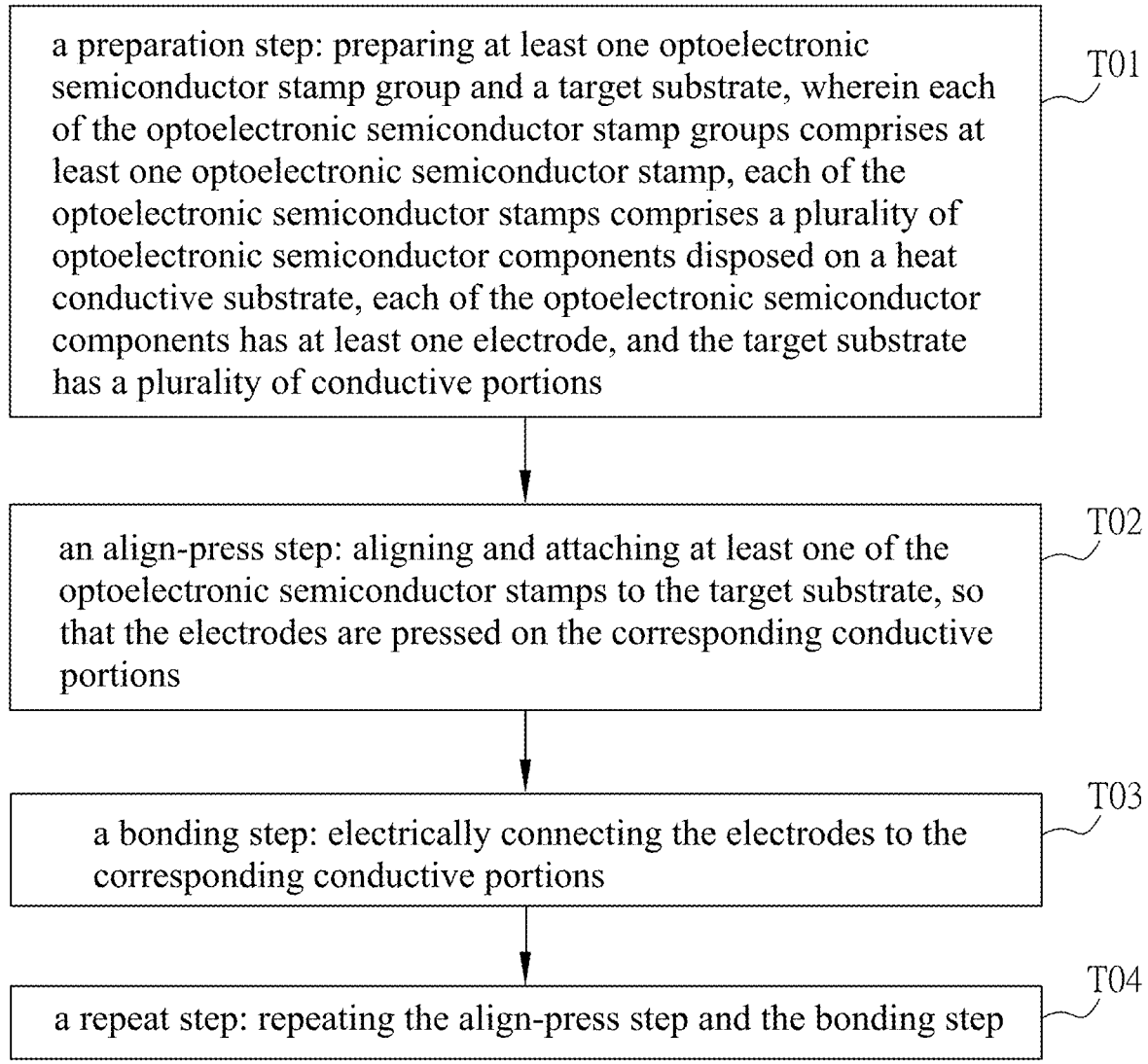
FIG. 3 is a flow chart of a method of using an optoelectronic semiconductor stamp to manufacture an optoelectronic semiconductor device of this disclosure.

FIG. 3 is a flow chart of a method of using an optoelectronic semiconductor stamp to manufacture an optoelectronic semiconductor device of this disclosure. As shown in FIG. 3, the method of using an optoelectronic semiconductor stamp to manufacture an optoelectronic semiconductor device of this disclosure at least comprises the following steps T01 to T04. In this embodiment, the step T01 is a preparation step, the step T02 is an align-press step, the step T03 is a bonding step, and the step T04 is a repeat step.

The steps T01 to T04 of the method of using an optoelectronic semiconductor stamp to manufacture an optoelectronic semiconductor device of this disclosure will be described hereinafter with reference to FIG. 3 in view of FIGS. 4A to 4L. FIGS. 4A to 4L are schematic diagrams showing the procedure of using an optoelectronic semiconductor stamp to manufacture an optoelectronic semiconductor device of this disclosure.

Figure 4A:
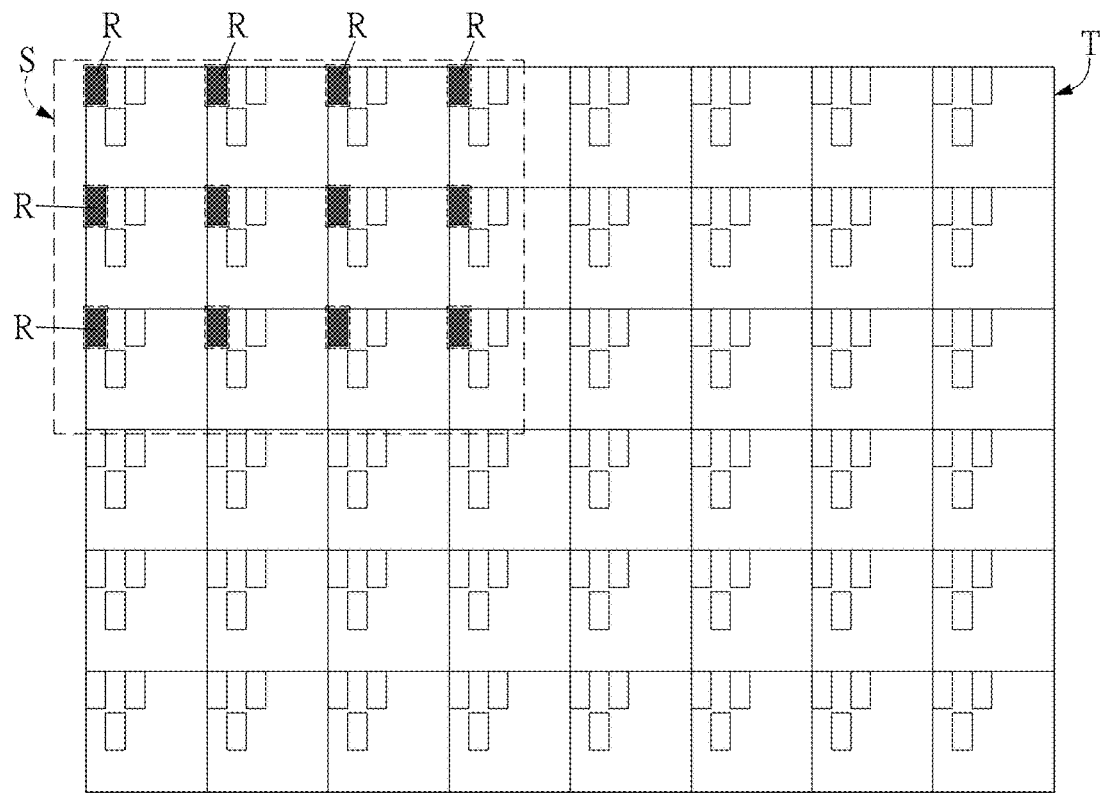
FIGS. 4A to 4L are schematic diagrams showing the procedure of using an optoelectronic semiconductor stamp to manufacture an optoelectronic semiconductor device of this disclosure.
Figure 4B:
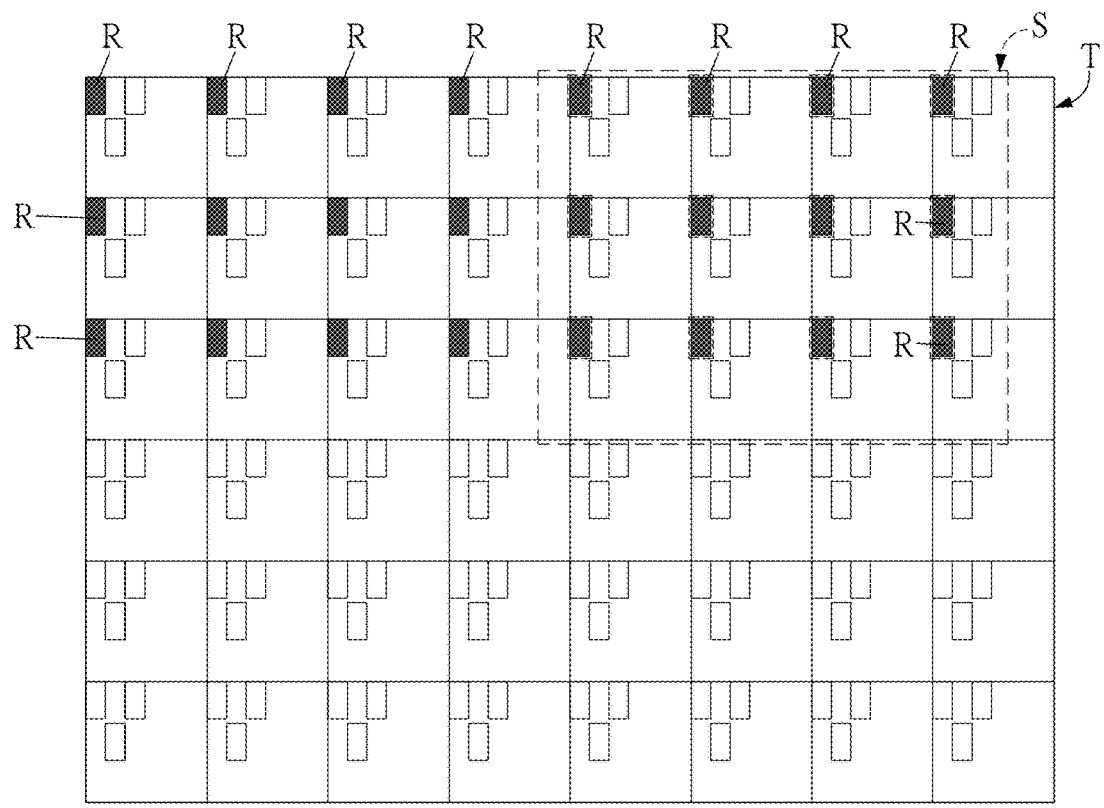
Figure 4C:
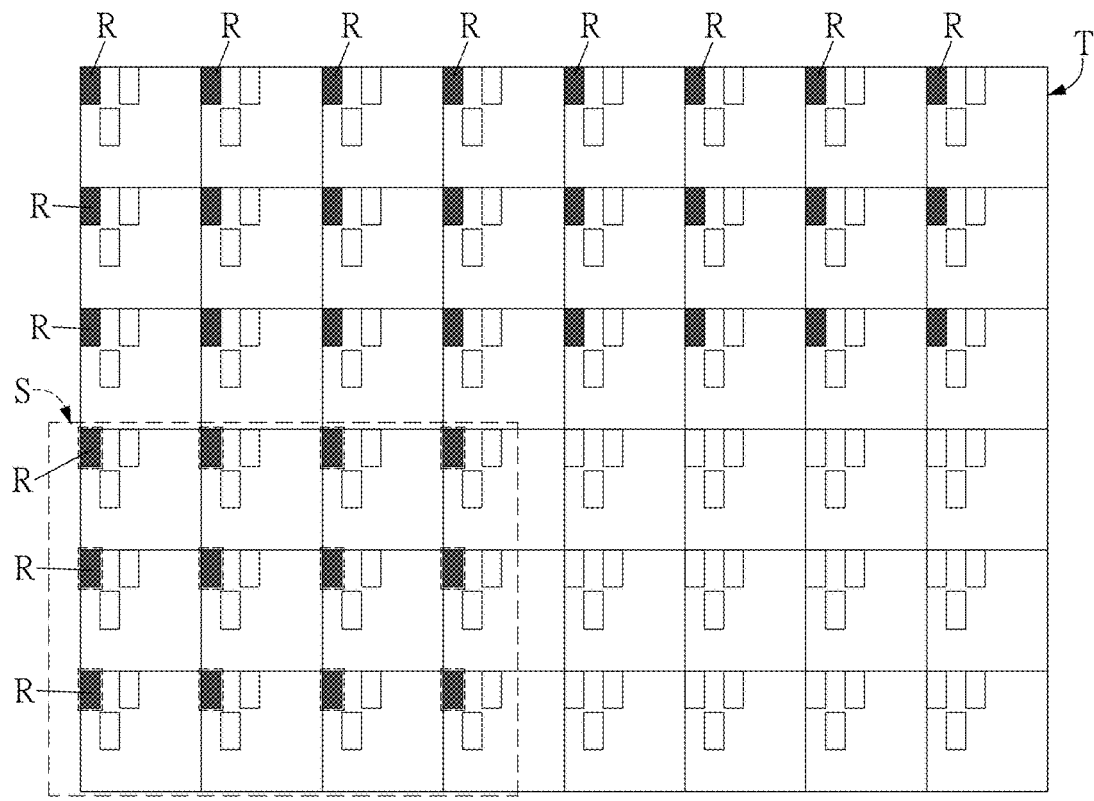
Figure 4D:
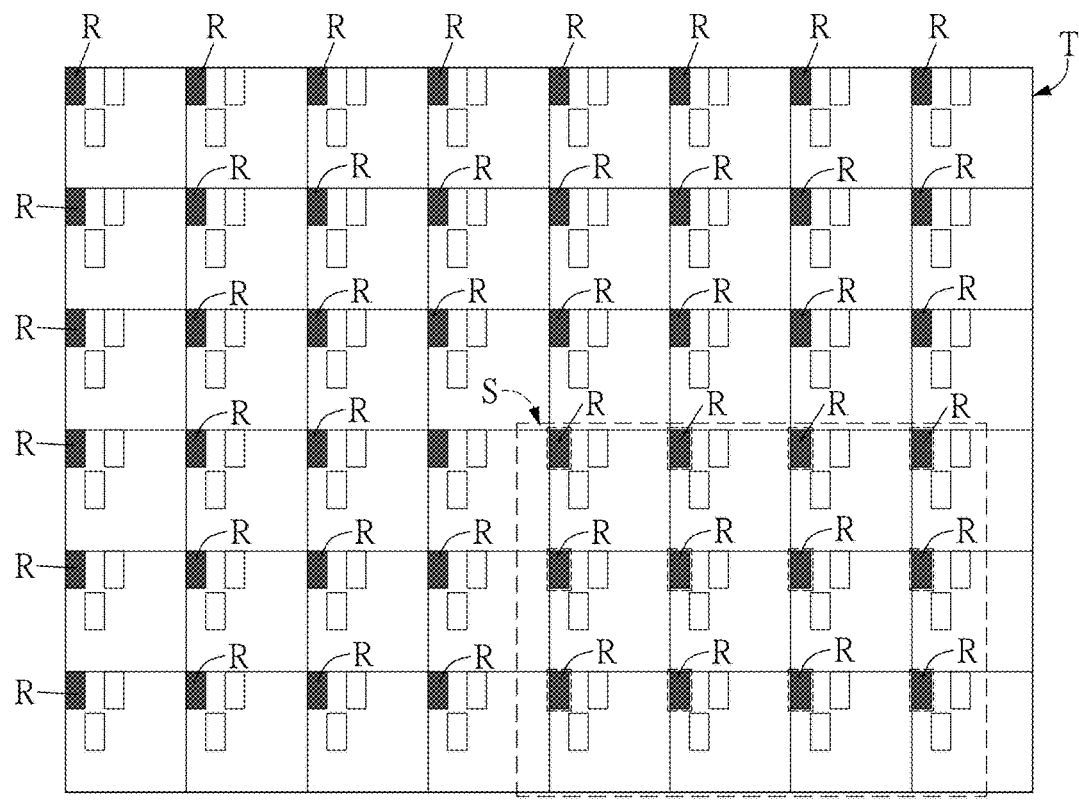
Figure 4E:
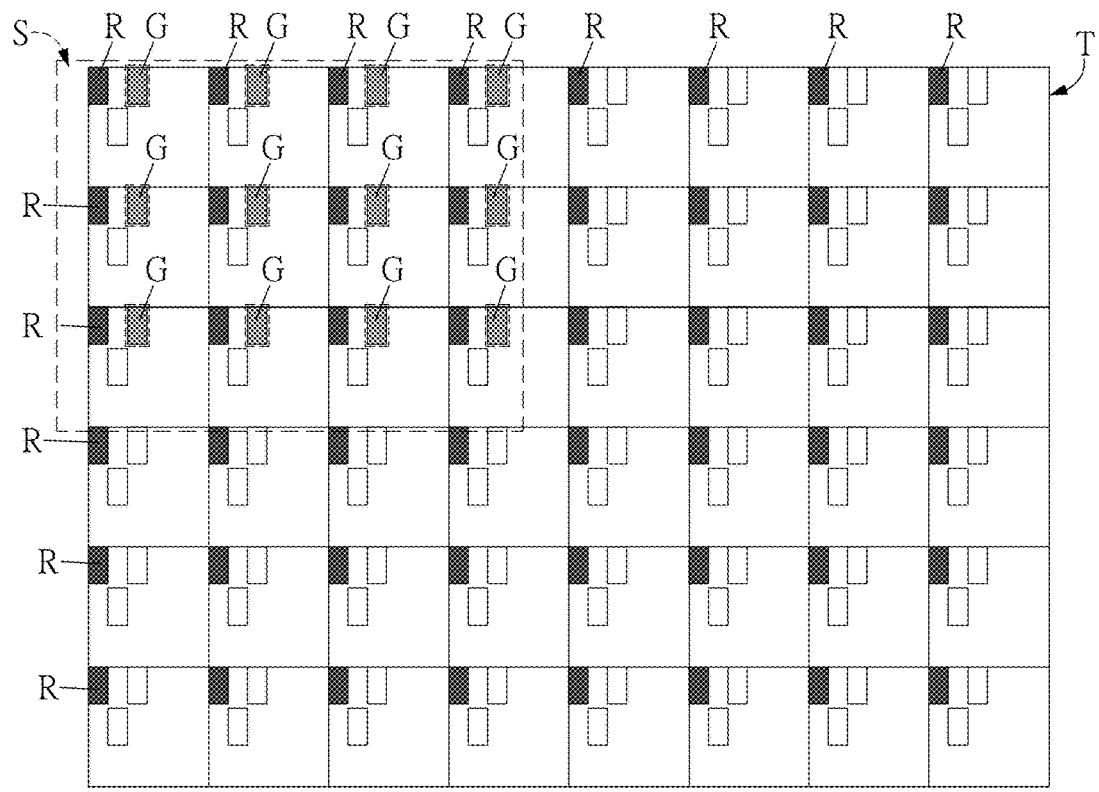
Figure 4F:
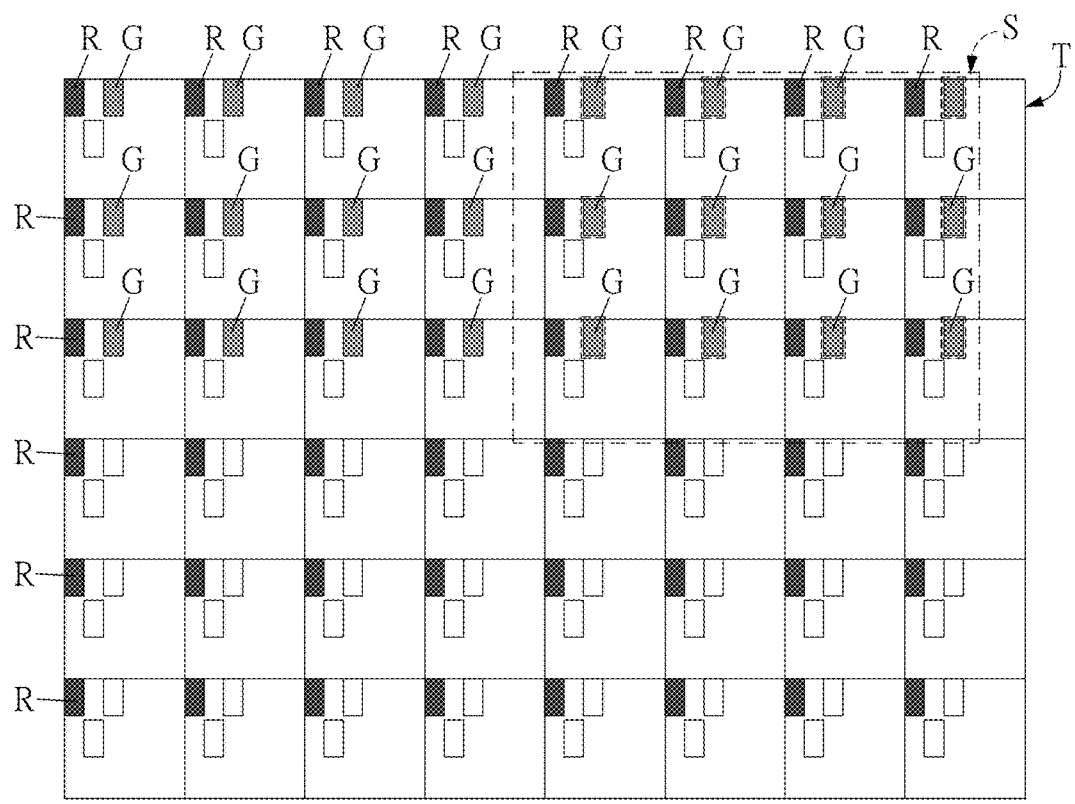
Figure 4G:
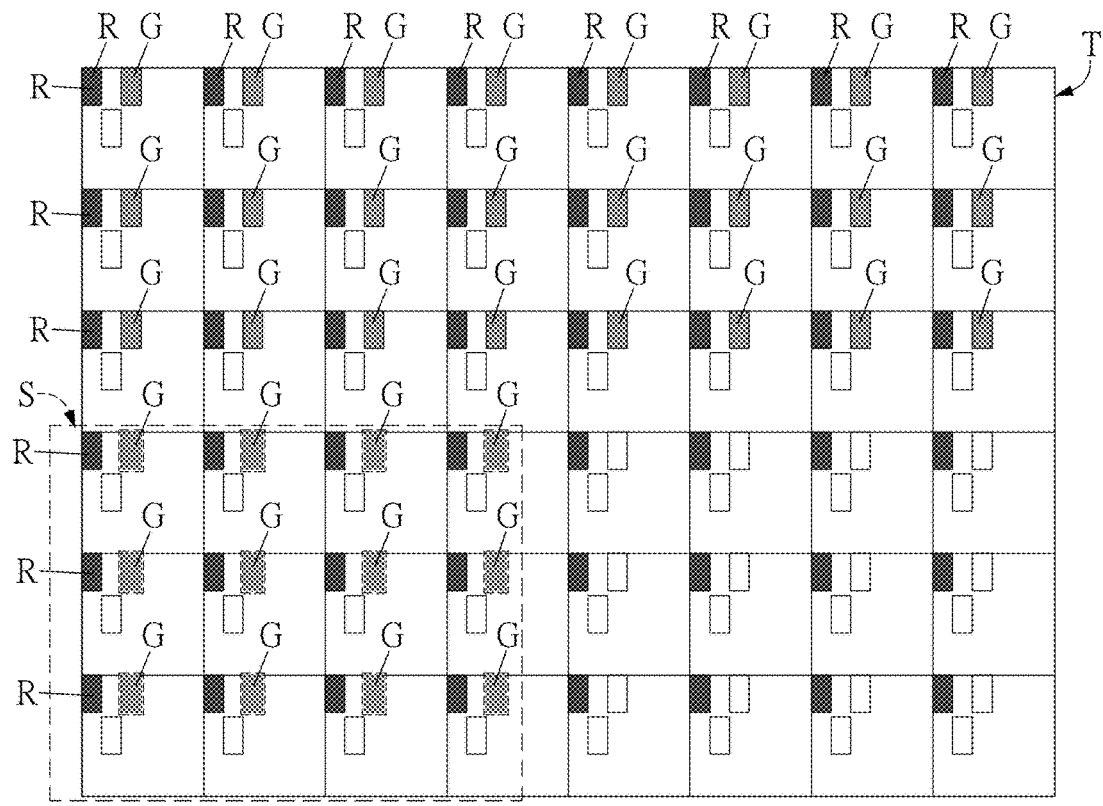
Figure 4H:
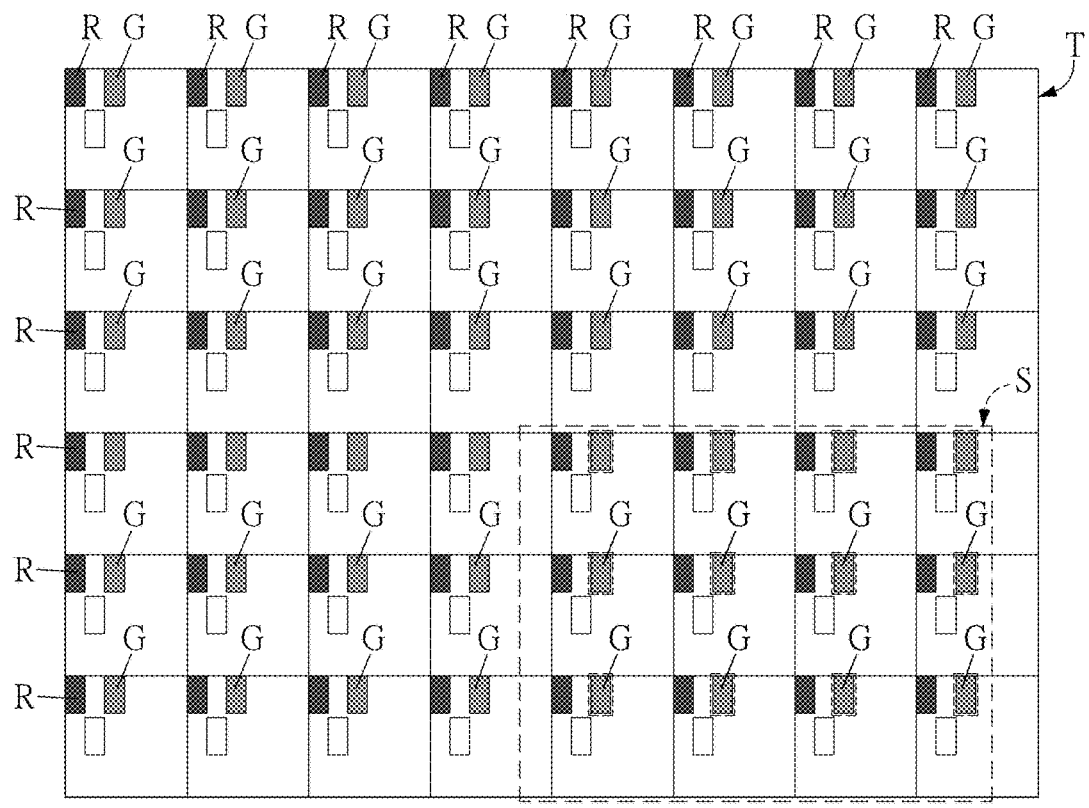
Figure 4I:
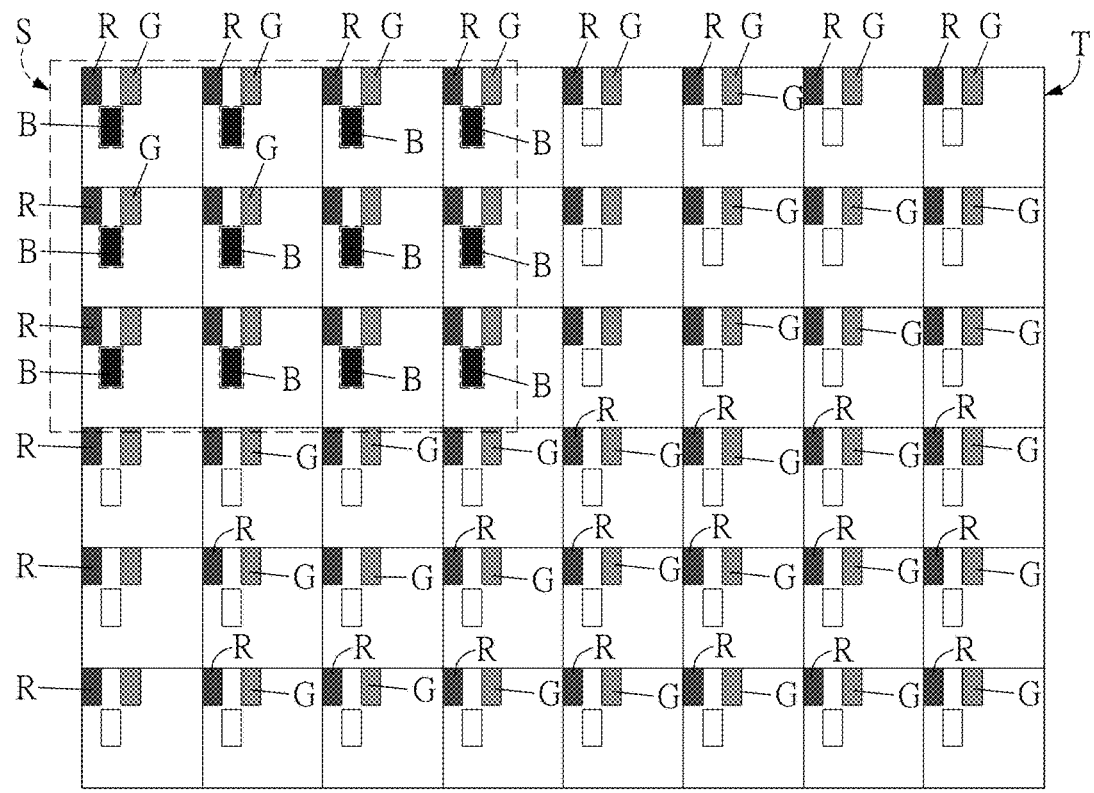
Figure 4J:
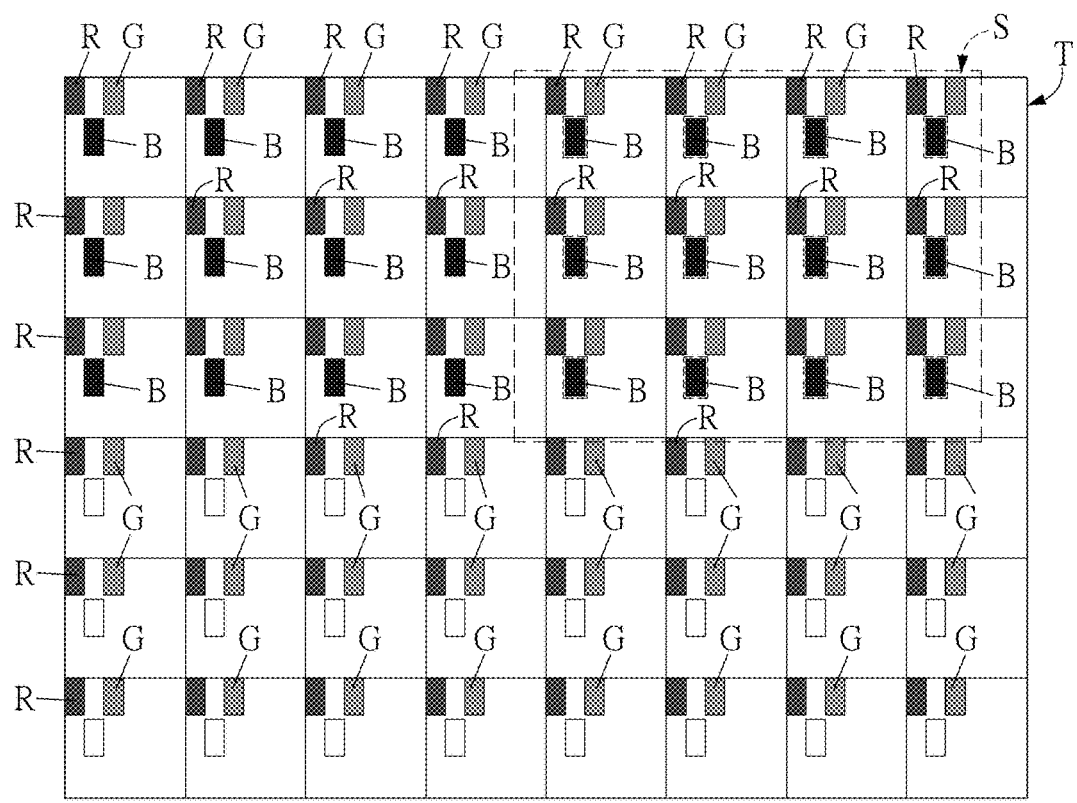
Figure 4K:
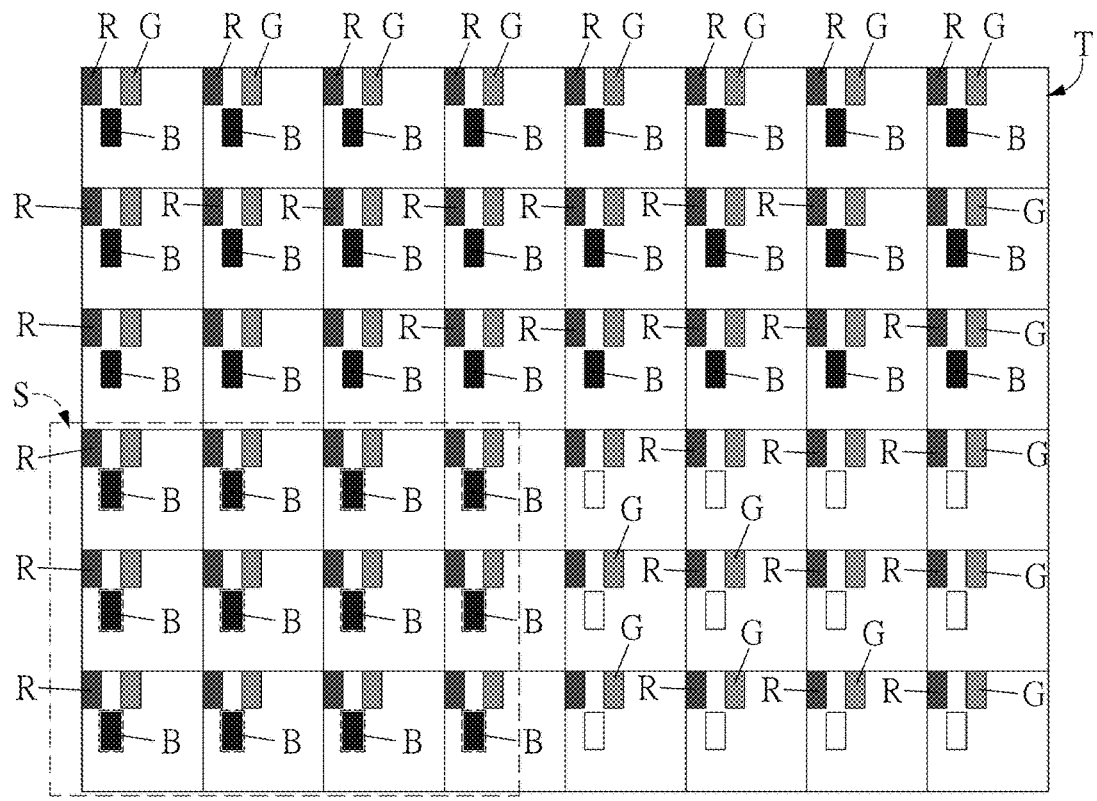

As shown in FIG. 3, the preparation step T01 is to prepare at least one optoelectronic semiconductor stamp group and a target substrate (the target substrate T as shown in FIG. 4A, wherein each square in the target substrate T represents one pixel). Each optoelectronic semiconductor stamp group comprises at least one optoelectronic semiconductor stamp S (see FIG. 4A). Each optoelectronic semiconductor stamp S comprises a plurality of optoelectronic semiconductor components (e.g. the red LED (R), the green LED (G), and the blue LED (B)) disposed on a heat conductive substrate. Each of the optoelectronic semiconductor components has at least one electrode, and the target substrate T has a plurality of conductive portions. In this embodiment, each optoelectronic semiconductor stamp group comprises three optoelectronic semiconductor stamps S, and the optoelectronic semiconductor components (R, G, B) in different optoelectronic semiconductor stamps S of the same optoelectronic semiconductor stamp group are arranged at the same positions on the heat conductive substrate.

Next, as shown in FIG. 4A, the align-press step T02 is to align and attach at least one of the optoelectronic semiconductor stamps S to the target substrate T, so that the electrodes are pressed on the corresponding conductive portions.

Afterwards, the bonding step T03 is to electrically connect the electrodes to the corresponding conductive portions. For example, the bonding step can be performed by eutectic bonding, laser bonding, or ACF bonding.

In one embodiment, the eutectic bonding comprises a heating step, a bonding step, and a removal step. The heating step is to heat the heat conductive substrate for transmitting heat to the electrodes. The bonding step is to utilize the heat transmitted to the electrodes to eutectic bond the electrodes to the corresponding conductive portions, thereby electrically connecting the electrodes to the corresponding conductive portions. The removal step is to remove the heat conductive substrate.

In one embodiment, before the align-press step T02, an ACF is disposed on the conductive portions, so that the ACF is located between the electrodes and the corresponding conductive portions. The method of ACF bonding comprises a heating step, a bonding step, and a removal step. The heating step is to heat the heat conductive substrate for transmitting heat to the electrodes. The bonding step is to utilize the heat transmitted to the electrodes to bond the electrodes to the corresponding conductive portions through the ACF, thereby electrically connecting the electrodes to the corresponding conductive portions. The removal step is to remove the heat conductive substrate.

In another embodiment, before the align-press step T02, an ACF is disposed on the conductive portions, so that the ACF is located between the electrodes and the corresponding conductive portions. The method of ACF bonding comprises a removal step, a heat-press step, and a bonding step. The removal step is to remove the heat conductive substrate, so that the optoelectronic semiconductor components are adhered to the ACF. The heat-press step is to heat and press the optoelectronic semiconductor components. The bonding step is to utilize the heat transmitted to the electrodes to bond the electrodes to the corresponding conductive portions through the ACF, thereby electrically connecting the electrodes to the corresponding conductive portions.

In one embodiment, the laser bonding comprises an irradiating step, a bonding step, and a removal step. The irradiating step is to provide a laser to irradiate a press interface incident from one side of the target substrate T away from the optoelectronic semiconductor stamp S. The bonding step is to utilize energy of the laser to melt and bond the electrodes to the corresponding conductive portions, thereby electrically connecting the electrodes to the corresponding conductive portions. The removal step is to remove the heat conductive substrate.

Figure 4L:
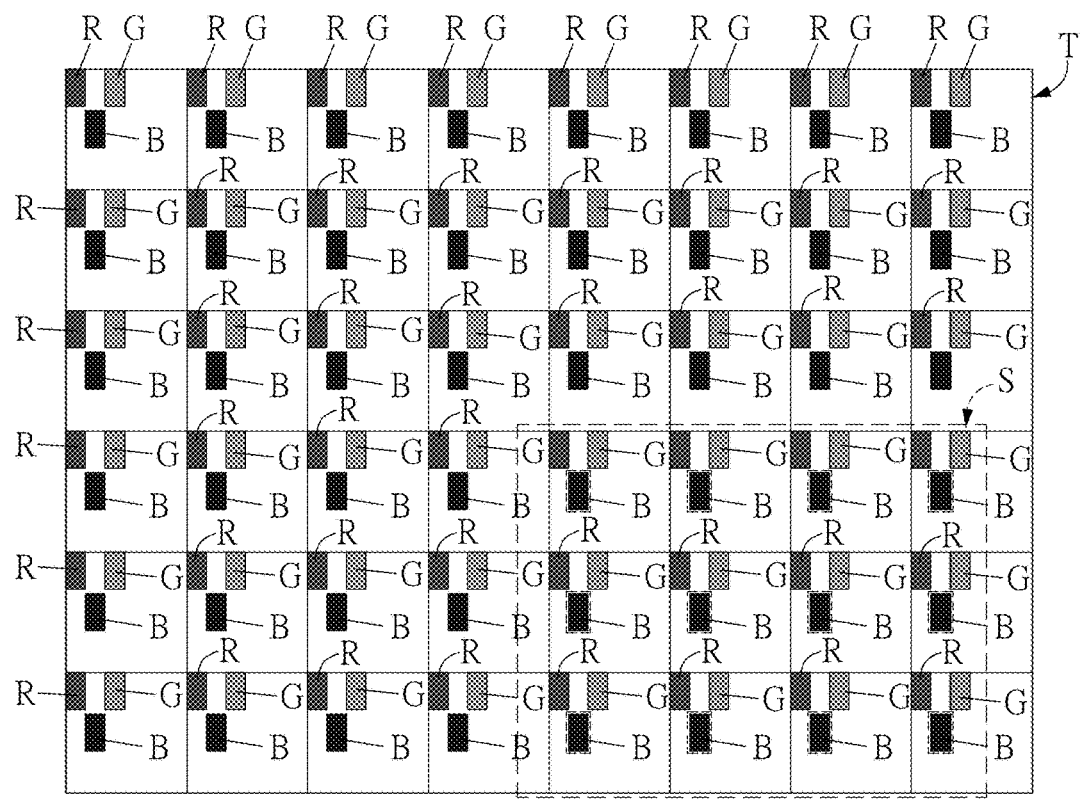

Finally, as shown in FIGS. 4B to 4L, the repeat step T04 is performed to repeat the align-press step T02 and the bonding step T03 for finishing the optoelectronic semiconductor device (see FIG. 4L). As shown in FIGS. 4A to 4D, a first optoelectronic semiconductor stamp S is provided to perform the transferring process of red LEDs R to the target substrate T, and totally 4 times of the transferring process are performed. As shown in FIGS. 4E to 4H, a second optoelectronic semiconductor stamp S is provided to perform the transferring process of green LEDs G to the target substrate T, and totally 4 times of the transferring process are performed. As shown in FIGS. 4I to 4L, a third optoelectronic semiconductor stamp S is provided to perform the transferring process of blue LEDs B to the target substrate T, and totally 4 times of the transferring process are performed. Accordingly, as shown in FIG. 4L, the finished optoelectronic semiconductor device comprises R, G, B pixels (R, G, B LEDs), so that the optoelectronic semiconductor device is manufactured as a full-color LED display device.

Figure 5A:
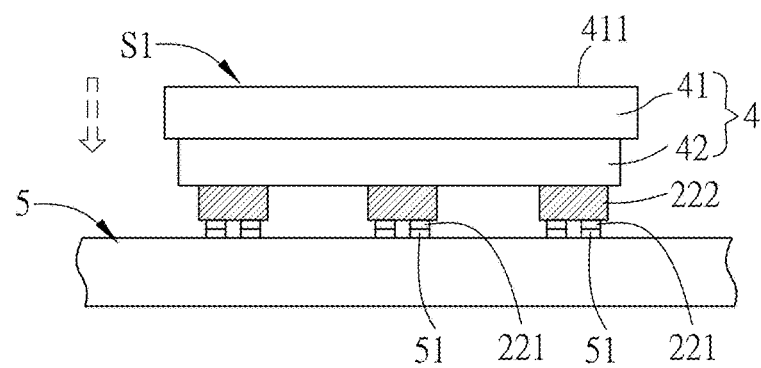
FIGS. 5A and 5B are schematic diagrams showing the manufacturing procedure of an optoelectronic semiconductor device according to another embodiment of this disclosure.
Figure 5B:
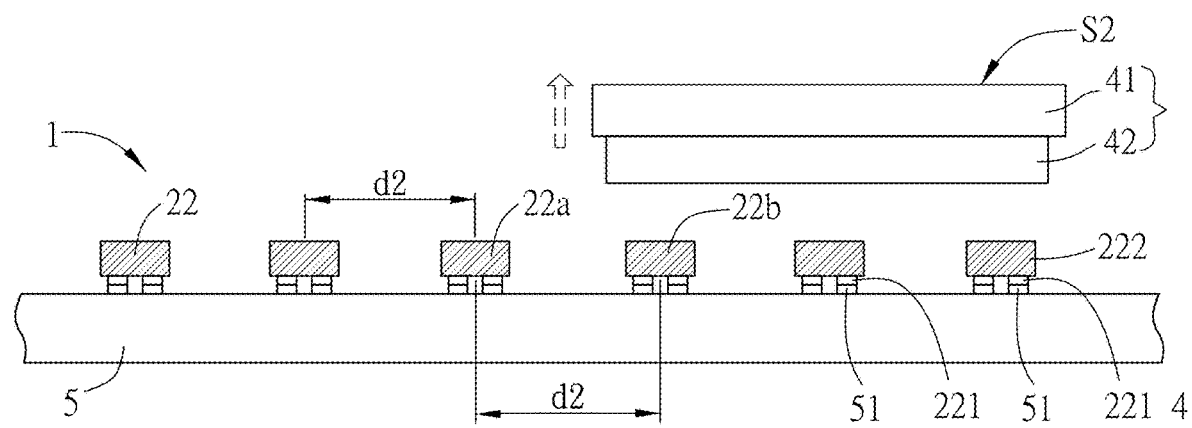

FIGS. 5A and 5B are schematic diagrams showing the manufacturing procedure of an optoelectronic semiconductor device according to an embodiment of this disclosure. Taking the optoelectronic semiconductor stamp S1 as an example, referring to FIG. 5A, after the optoelectronic semiconductor stamp S1 is pressed on a target substrate 5, and then the electrodes 221 of the optoelectronic semiconductor components 22 on the optoelectronic semiconductor stamp S1 are electrically connected with the corresponding electrical conductive portions 51 of the target substrate 5. In this embodiment, the target substrate 5 comprises a plurality of electrical conductive portions 51, and the electrical conductive portions 51 are disposed corresponding to the electrodes 221 of the optoelectronic semiconductor components 22. In some embodiments, the optoelectronic semiconductor stamp S1 is picked up (by grabbing or sucking) from one side (surface 411) of the heat conductive base 41 away from the optoelectronic semiconductor components 22. In some embodiments, the thermal conductivity of the heat conductive substrate 4 (or heat conductive base) can be greater than 1 W/mK. Accordingly, a bonding machine (e.g. a ball bonder) can be used to grab or suck the heat conductive substrate 4 and to heat the heat conductive substrate 4. Then, the heat can be transmitted through the heat conductive substrate 4 for heating the electrodes 221 of the optoelectronic semiconductor components 22 on the heat conductive substrate 4, thereby electrically connecting the electrodes 221 to the corresponding electrical conductive portions 51 by eutectic bonding. Since the adhesion of the buffer layer 42 can be decreased at high temperature, the step of heating the heat conductive substrate 4 can facilitate the bonding of the optoelectronic semiconductor components 22 on the optoelectronic semiconductor stamp S1 and the electrical conductive portions 51 of the target substrate 5. Accordingly, this process can make the optoelectronic semiconductor components 22 be easily departed from the heat conductive substrate 4. Then, the heat conductive substrate 4 can be removed.

Excepting the eutectic bonding, in other embodiments, after picking up the optoelectronic semiconductor stamp S1 from the side of the heat conductive base 41 away from the optoelectronic semiconductor components 22 and pressing the optoelectronic semiconductor stamp S1 on the target substrate 5, the electrodes 221 of the optoelectronic semiconductor components 22 can be electrically connected with the corresponding electrical conductive portions 51 by anisotropic conductive film (ACF, not shown). Afterwards, the heat conductive substrate 4 can be removed. Besides, the laser bonding can be applied to finish the bonding process, and this disclosure is not limited.

When the bonder picks up and heats the heat conductive substrate 4, the bonding force between the electrical conductive portions 51 and the electrodes 221 of the optoelectronic semiconductor components 22 (or the bonding force between the electrodes 221 and the ACF) is greater than the adhesion between the buffer layer 42 and the optoelectronic semiconductor components 22, so that the heat conductive substrate 4 can be easily removed, and the optoelectronic semiconductor components 22 can be remained on the target substrate 5 and electrically connected with the electrical conductive portions 51 of the target substrate 5. Accordingly, after the electrical connection bonding and removing the heat conductive substrate 4, the target substrate 5 containing a plurality of optoelectronic semiconductor components 22 can be manufactured (see FIG. 5B).

To be noted, the above embodiment is to electrical connect the electrodes 221 with the corresponding electrical conductive portions 51 (by eutectic bonding or ACF) before removing the heat conductive substrate 4, but this disclosure is not limited thereto. In other embodiments, an adhesive layer (not shown) can be applied on the target substrate 5, and the adhesion between the adhesive layer and the optoelectronic semiconductor components 22 is greater than the adhesion between the optoelectronic semiconductor components 22 and the heat conductive substrate 4. Accordingly, after picking up the optoelectronic semiconductor stamp S1 and adhering the electrodes 221 of the optoelectronic semiconductor components 22 to the adhesive layer, the heat conductive substrate 4 is removed, and then the electrodes 221 of the optoelectronic semiconductor components 22 are electrically connected with the corresponding electrical conductive portions 51 by eutectic bonding or anisotropic conductive film (ACF). This disclosure is not limited.

In some embodiments, the laser can be provided to irradiate a press interface between the electrodes 221 and the corresponding conductive portions 51 from one side of the target substrate 5 away from the optoelectronic semiconductor stamp S1 (i.e. the lower side of the target substrate 5), thereby providing the energy for melting and bonding the electrodes 221 to the corresponding conductive portions 51 so as to electrically connect the electrodes 221 to the corresponding conductive portions 51. After that, the heat conductive substrate 4 is removed.

In some embodiments, the target substrate 5 can be made of a transparent material, such as glass, quartz or the likes, plastics, rubber, glass fiber, or other polymer materials. In some embodiments, the target substrate 5 can be made of opaque materials, such as a metal-glass fiber composition plate, or a metal-ceramics composition plate. In addition, the target substrate 5 can be a rigid plate or a flexible plate, and this disclosure is not limited. In some embodiments, the target substrate 5 comprises a matrix circuit (not shown, the matrix circuit comprises the electrical conductive portions 51 arranged in an array). According to the circuit type, the matrix circuit can be an active matrix (AM) circuit or a passive matrix (PM) circuit. In some embodiments, the target substrate 5 can be a thin-film transistor (TFT) substrate. The TFT substrate is configured with thin-film components (e.g. thin-film transistors) and thin-film circuits. For example, the TFT substrate can be an AM TFT substrate or a PM TFT substrate. For example, the AM substrate (AM TFT substrate) comprises a matrix circuit containing interlaced data lines and scan lines and a plurality of thin-film transistors. Since the AM substrate or PM substrate can be easily understood by the skilled person in the art and is not the key point of this disclosure, so the detailed description thereof will be omitted.

Afterwards, the pressing step is repeated as shown in FIG. 5B. After pressing another optoelectronic semiconductor stamp S2 on the target substrate 5, the electrodes 221 of the optoelectronic semiconductor components 22 of the optoelectronic semiconductor stamp S2 are electrically connected with the corresponding electrical conductive portions 51 of the target substrate 5. Accordingly, the optoelectronic semiconductor device 1 can be obtained.

To be noted, during manufacturing process of the optoelectronic semiconductor stamp S2, the step S04 of decreasing the adhesion of at least a part of the UV tape 3 (see FIG. 2E) is to move the UV light (light L2) irradiated positions by, for example, a first pitch d1, wherein the UV tape 3 is remained at the original position (the UV tape 3 is not moved). In addition, when electrically bonding the optoelectronic semiconductor stamp S2 to the target substrate 5, the target substrate 5 is not moved, and the optoelectronic semiconductor stamp S2 is moved by a pitch (e.g. the second pitch d2). Accordingly, a plurality of optoelectronic semiconductor components 22 of the optoelectronic semiconductor stamp S2 can be disposed corresponding to the adjacent positions of the optoelectronic semiconductor components 22 of the optoelectronic semiconductor stamp S1, which have been transferred to the target substrate 5. Therefore, regarding two adjacent optoelectronic semiconductor components 22 on the target substrate 5, as shown in FIG. 5B, if one of the optoelectronic semiconductor components 22 (e.g. an optoelectronic semiconductor component 22a) is from the optoelectronic semiconductor stamp S1, the other optoelectronic semiconductor component (e.g. an optoelectronic semiconductor component 22b) is from the optoelectronic semiconductor stamp S2, and the pitch between the two adjacent optoelectronic semiconductor components is still the second pitch d2.

In addition, the two adjacent optoelectronic semiconductor components 22 from the optoelectronic semiconductor stamp S1 have a second pitch d2, so that the two adjacent optoelectronic semiconductor components 22 disposed on the target substrate also have a second pitch d2. The two adjacent optoelectronic semiconductor components 22 from the optoelectronic semiconductor stamp S2 have a second pitch d2, so that the two adjacent optoelectronic semiconductor components 22 disposed on the target substrate also have a second pitch d2. Moreover, as shown in FIG. 5B, the pitch between the leftmost optoelectronic semiconductor component (22b) from the optoelectronic semiconductor stamp S2 and the rightmost optoelectronic semiconductor component (22a) from the optoelectronic semiconductor stamp S1 can be a second pitch d2 based on the design requirement. Of course, the pitch between the optoelectronic semiconductor component (22b) and the optoelectronic semiconductor component (22a) can be not equal to the second pitch d2 based on the design requirement. Of course, the pitch between the two optoelectronic semiconductor components can be approximated to the second distance d2 but not equal to the second distance d2 due to the process accuracy.

As shown in FIG. 5B, adjacent two optoelectronic semiconductor components (e.g. 22a and 22b) on the target substrate 5 of the optoelectronic semiconductor device 1 can be defined in one pixel or different pixels. In addition, the optoelectronic semiconductor component 22 from the optoelectronic semiconductor stamp S1 and the optoelectronic semiconductor component 22 from the optoelectronic semiconductor stamp S2 can emit the same color lights or different color lights, or can be the same kinds or types of optoelectronic semiconductor components or different kinds or types of optoelectronic semiconductor components. This disclosure is not limited. If the optoelectronic semiconductor component 22 from the optoelectronic semiconductor stamp S1 and the optoelectronic semiconductor component 22 from the optoelectronic semiconductor stamp S2 can emit the same color lights, the optoelectronic semiconductor device 1 can be a monochromatic LED display device. If the optoelectronic semiconductor component 22 from the optoelectronic semiconductor stamp S1 and the optoelectronic semiconductor component 22 from the optoelectronic semiconductor stamp S2 can emit different color lights, the optoelectronic semiconductor device 1 can be a full-color LED display device having, for example, red, green and blue pixels. This disclosure is not limited.

For example, in order to manufacturing an AM LED display device, only the bonding machine (e.g. a flip-chip bonding machine or a die bonding machine) in cooperate with the eutectic bonding process or ACF bonding process is required for transferring and combining a plurality of optoelectronic semiconductor components (LEDs) from the optoelectronic semiconductor stamp to the TFT substrate (target substrate) based on the required size or shape, thereby finishing the manufacturing of the AM LED display device.

As mentioned above, the optoelectronic semiconductor device 1 of this embodiment can be manufactured by transferring a plurality of optoelectronic semiconductor components 22 from the optoelectronic semiconductor substrate 2. In one embodiment, a plurality of optoelectronic semiconductor components 22 are transferred from at least one optoelectronic semiconductor stamp to the target substrate 5 so as to obtain the optoelectronic semiconductor device 1. In other words, the optoelectronic semiconductor components 22 are batch transferred from the optoelectronic semiconductor stamp S1 to the target substrate 5 and then combined to fabricate the optoelectronic semiconductor device 1 of the desired size and shape. As shown in FIG. 5B, the optoelectronic semiconductor device 1 of this embodiment comprises a target substrate 5 and a plurality of optoelectronic semiconductor components 22 from the optoelectronic semiconductor stamps (S1 and S2), and the electrodes 221 of the optoelectronic semiconductor components 22 are electrically connected with the corresponding electrical conductive portions 51 of the target substrate 5. In some embodiments, the electrodes 221 can be electrically connected with the corresponding electrical conductive portions 51 by eutectic bonding, ACF bonding, or laser bonding. In addition, the second pitch d2 between two adjacent optoelectronic semiconductor components 22 on the target substrate 5 can be greater than or equal to the first pitch d1 between two adjacent optoelectronic semiconductor components 22 on the optoelectronic semiconductor stamps. The second pitch d2 is n times of the first pitch d1, and n is an integer greater than or equal to 1. In some embodiments, the optoelectronic semiconductor device 1can be an LED display device, a light sensing device, or a laser array. In this embodiment, the LED display device also comprises a Mini LED display device or a Micro LED display device.

In some embodiments, the optoelectronic semiconductor components on the heat conductive substrate of the optoelectronic semiconductor stamp (Si1 or S2) can be arranged in a polygon shape, such as, for example but not limited to, a triangle, a square, a diamond, a rectangle, a trapezoid, a parallelogram, a hexagon, or an octagon, . . . or other shapes. Accordingly, the required optoelectronic semiconductor components 22 can be transferred from the optoelectronic semiconductor stamps (S1 and/or S2) to the target substrate 5 and then combined to obtain the optoelectronic semiconductor device in the desired shape (e.g. a rectangle). This configuration can increase the total utility rate of the circular wafer.

Figure 6A:
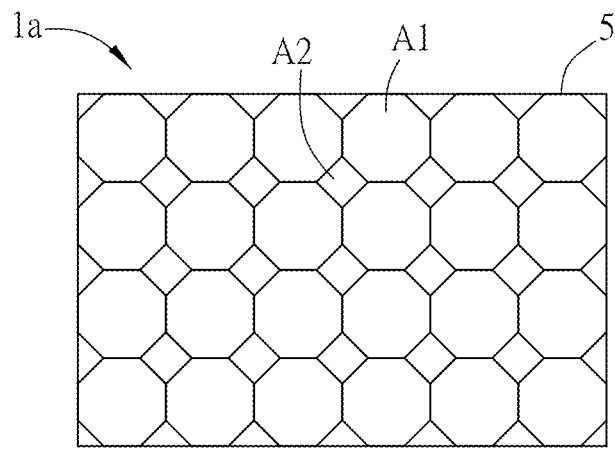
FIGS. 6A and 6B are schematic diagrams showing the combined shapes of the optoelectronic semiconductor devices according to different embodiments of this disclosure.
Figure 6B:
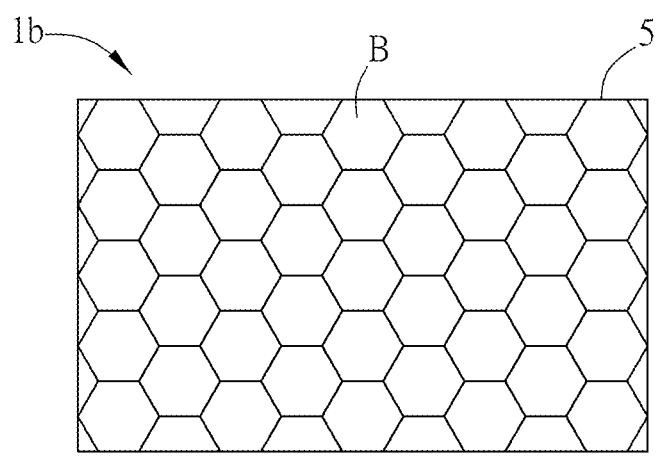

FIGS. 6A and 6B are schematic diagrams showing the combined shapes of the optoelectronic semiconductor devices 1a and 1b according to different embodiments of this disclosure. In this embodiment, a covering range of the optoelectronic semiconductor stamp aligned and pressed on the target substrate can be a polygon, a circle, or an oval. As shown in FIGS. 6A and 6B, a plurality of optoelectronic semiconductor stamps are transferred to and combined on the target substrate 5, and the target substrate 5 is correspondingly covered by a plurality of optoelectronic semiconductor stamps, thereby forming a rectangular display device. The stamp covering range is the arranging shape of the optoelectronic semiconductor components on the heat conductive substrate of the optoelectronic semiconductor stamp, and the stamp covering range can be a polygonal shape. In the optoelectronic semiconductor device 1a of FIG. 6A, the stamp covering range A1 on the target substrate 5 is an octagon, and the stamp covering range A2 on the target substrate 5 is a diamond. In the optoelectronic semiconductor device 1b of FIG. 6B, the stamp covering range B on the target substrate 5 is a hexagon. This disclosure is not limited thereto. In other embodiments, the stamp covering range can be designed as other shapes, such as a square, a rectangle, a trapezoid, a parallelogram, a circle, an oval, or any of other shapes depending on the design requirement. In addition, in the repeat step T04, the covering range of the subsequently used optoelectronic semiconductor stamp aligned and pressed on the target substrate can at least partially include the covering range of the previously used optoelectronic semiconductor stamp aligned and pressed on the target substrate (partially overlap). Alternatively, the covering range of the subsequently used optoelectronic semiconductor stamp aligned and pressed on the target substrate can exclude the covering range of the previously used optoelectronic semiconductor stamp aligned and pressed on the target substrate (not overlap). This disclosure is not limited.

FIGS. 7A to 7D are schematic diagrams showing the manufacturing procedures of an optoelectronic semiconductor stamp S3 according to a second embodiment of this disclosure, and FIGS. 8A to 8D are schematic diagrams showing the manufacturing procedures of an optoelectronic semiconductor stamp S4 according to a third embodiment of this disclosure.

Figure 7A:
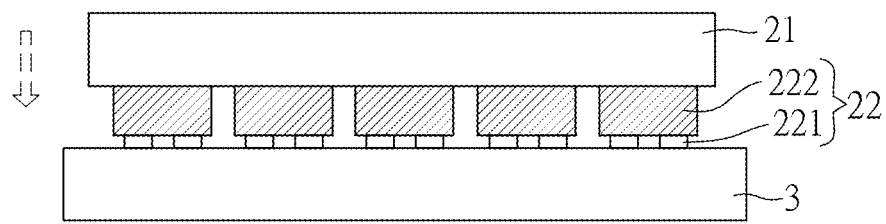
FIGS. 7A to 7D are schematic diagrams showing the manufacturing procedures of an optoelectronic semiconductor stamp according to a second embodiment of this disclosure.
Figure 7B:
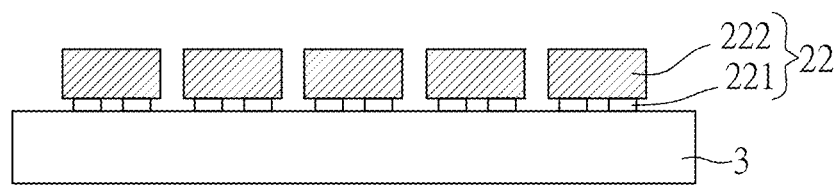
Figure 7C:
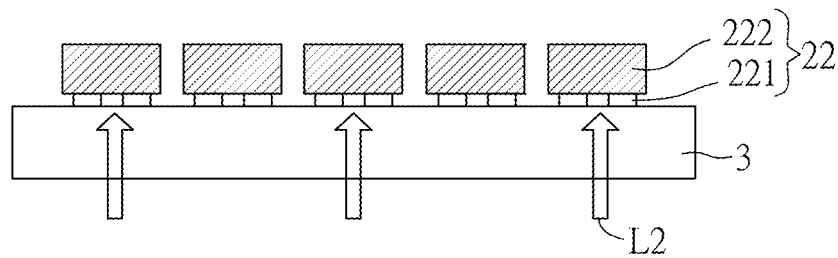
Figure 7D:
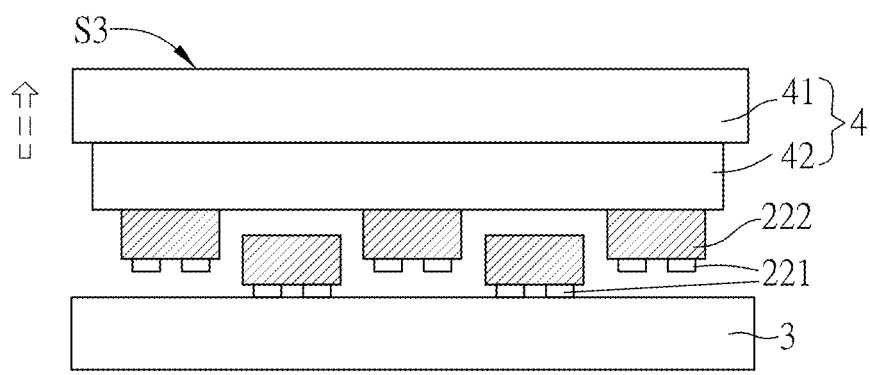

Different from the first embodiment, in the second embodiment as shown in FIGS. 7A to 7D, the epitaxial substrate 21 is a GaAs substrate, and the optoelectronic semiconductor components 22 can be red LED chips, yellow LED chips, laser LED chips, sensing chips, or IR chips. In addition, as shown in FIGS. 7A and 7B, the step S03 of removing the epitaxial substrate 21 is to directly remove the epitaxial substrate 21 by an etching process (wet etching process) or a polishing process. The other steps of the manufacturing method of the optoelectronic semiconductor stamp S3 of the second embodiment are the same as the first embodiment, so the detailed descriptions thereof will be omitted.

Figure 8A:
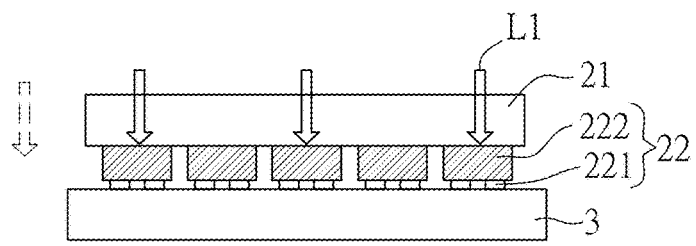
FIGS. 8A to 8D are schematic diagrams showing the manufacturing procedures of an optoelectronic semiconductor stamp according to a third embodiment of this disclosure.
Figure 8B:
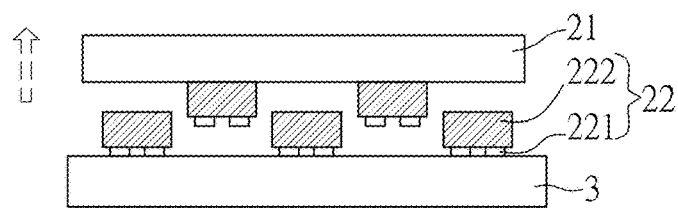
Figure 8C:
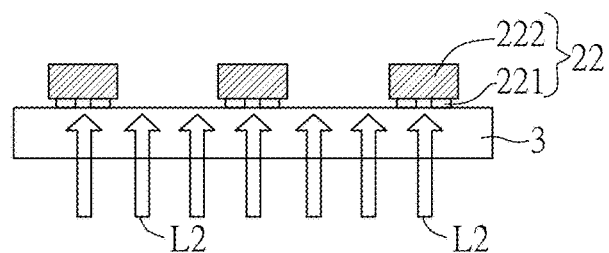
Figure 8D:
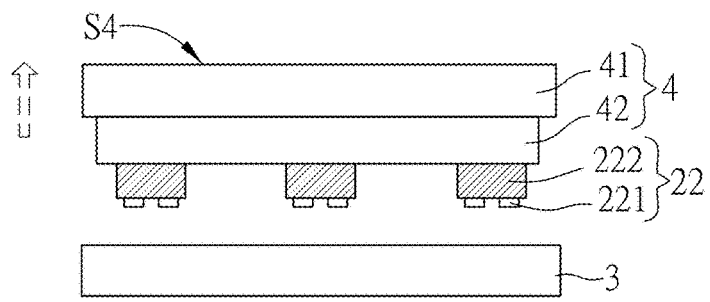

Different from the first embodiment, in the third embodiment as shown in FIGS. 8A to 8D, before the step S03 of removing the epitaxial substrate 21, a light is provided to irradiate the connection junction between the epitaxial substrate 21 and a part of the optoelectronic semiconductor components 22 (selective laser lift off (LLO) technology) as shown in FIG. 8A. For example, the optoelectronic semiconductor components 22 are alternately irradiated by the light. Afterwards, in the step S03 of removing the epitaxial substrate 21, as shown in FIG. 8B, a part of the optoelectronic semiconductor components 22, which are not irradiated by the light L1, can be remained on the epitaxial substrate 21, and the other optoelectronic semiconductor components 22, which are irradiated by the light L1, can be remained on the UV tape 3 after removing the epitaxial substrate 21. In addition, as shown in FIG. 8C, this embodiment is to provide non-selective UV light (light L2) to irradiate the UV tape 3 for curing the adhesive glue of the UV tape 3. Accordingly, the adhesion between all optoelectronic semiconductor components 22 and the UV tape 3 can be decreased. The other steps of the manufacturing method of the optoelectronic semiconductor stamp S4 of the third embodiment are the same as the first embodiment, so the detailed descriptions thereof will be omitted.

In summary, the method of using an optoelectronic semiconductor stamp to manufacture an optoelectronic semiconductor device comprises steps of: preparing at least one optoelectronic semiconductor stamp group and a target substrate, wherein each of the optoelectronic semiconductor stamp group comprises at least one optoelectronic semiconductor stamp, each of the optoelectronic semiconductor stamp comprises a plurality of optoelectronic semiconductor components disposed on a heat conductive substrate, each of the optoelectronic semiconductor components has at least one electrode, and the target substrate has a plurality of conductive portions; performing an align-press step for aligning and attaching at least one of the optoelectronic semiconductor stamps to the target substrate, so that the electrodes are pressed on the corresponding conductive portions; and performing a bonding step: electrically connecting the electrodes to the corresponding conductive portions. Compared with the conventional manufacturing processes of optoelectronic device made of LEDs, which is to perform the epitaxial process, the photolithograph process, and the cutting processes (including half-cut, point measurement and full-cut processes) to obtain the individual optoelectronic semiconductor components, this disclosure does not need to transfer the optoelectronic semiconductor components to the target substrate one by one. As a result, this disclosure has the advantages of simple processes and short manufacturing time. Besides, this disclosure can achieve the goal of batch transferring, so that the optoelectronic semiconductor device can have shorter manufacturing time and lower cost.

Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

What is claimed is:

1. A method of manufacturing an optoelectronic semiconductor device, comprising steps of:
   a preparation step: preparing at least one optoelectronic semiconductor stamp group and a target substrate, wherein each of the at least one optoelectronic semiconductor stamp group comprises at least one optoelectronic semiconductor stamp, a manufacturing method of each of the at least one optoelectronic semiconductor stamp comprises steps of: providing an optoelectronic semiconductor substrate, wherein the optoelectronic semiconductor substrate comprises a plurality of optoelectronic semiconductor components separately disposed on an epitaxial substrate, and each of the optoelectronic semiconductor components comprises at least one electrode; pressing the optoelectronic semiconductor substrate to an UV tape, wherein the electrodes of the optoelectronic semiconductor components are adhered to the UV tape; removing the epitaxial substrate, wherein a part of the optoelectronic semiconductor components are adhered to the UV tape; decreasing adhesion of the UV tape; and picking up the part of the optoelectronic semiconductor components adhered to the UV tape by a heat conductive substrate so as to obtain the optoelectronic semiconductor stamp, wherein the target substrate has a plurality of conductive portions;
   an align-press step: aligning and attaching the at least one optoelectronic semiconductor stamp to the target substrate, so that the electrodes are pressed on the corresponding conductive portions;
   a bonding step: electrically connecting the electrodes to the corresponding conductive portions; and
   a repeat step: repeating the align-press step and the bonding step,
   wherein the at least one optoelectronic semiconductor stamp group comprises a first optoelectronic semiconductor stamp group, the first optoelectronic semiconductor stamp group comprises a first optoelectronic semiconductor stamp and a second optoelectronic semiconductor stamp, the optoelectronic semiconductor components of the first optoelectronic semiconductor stamp and the second optoelectronic semiconductor stamp emit the same color lights, and
   wherein in the repeating step, a covering range of the second optoelectronic semiconductor stamp aligned and pressed on the target substrate excludes a covering range of the first optoelectronic semiconductor stamp aligned and pressed on the target substrate.

2. The method of claim 1, wherein the at least one optoelectronic semiconductor stamp group further comprises a second optoelectronic semiconductor stamp group, the second optoelectronic semiconductor stamp group comprises a third optoelectronic semiconductor stamp, the optoelectronic semiconductor components of the third optoelectronic semiconductor stamp and the optoelectronic semiconductor components of the first optoelectronic semiconductor stamp emit the different color lights, wherein in the repeating step, a covering range of the third optoelectronic semiconductor stamp aligned and pressed on the target substrate comprises the covering range of the first optoelectronic semiconductor stamp aligned and pressed on the target substrate.

3. The method of claim 1, wherein a covering range of the optoelectronic semiconductor stamp aligned and pressed on the target substrate is a polygon, a circle, or an oval.

4. The method of claim 1, wherein the optoelectronic semiconductor components of the first optoelectronic semiconductor stamp and the second optoelectronic semiconductor stamp are arranged at the same positions on the heat conductive substrates of the first optoelectronic semiconductor stamp and the second optoelectronic semiconductor stamp.

5. The method of claim 4, wherein the at least one optoelectronic semiconductor stamp group further comprises a second optoelectronic semiconductor stamp group, the second optoelectronic semiconductor stamp group comprises a third optoelectronic semiconductor stamp, the optoelectronic semiconductor components of the third optoelectronic semiconductor stamp and the optoelectronic semiconductor components of the first optoelectronic semiconductor stamp emit the different color lights, wherein in the repeating step, a covering range of the third optoelectronic semiconductor stamp aligned and pressed on the target substrate comprises the covering range of the first optoelectronic semiconductor stamp aligned and pressed on the target substrate.

6. The method of claim 1, wherein the bonding step is performed by eutectic bonding, laser bonding, or ACF bonding.

7. The method of claim 6, wherein the eutectic bonding comprises following steps of:
   a heating step: heating the heat conductive substrate for transmitting heat to the electrodes;
   a bonding step: utilizing the heat transmitted to the electrodes to eutectic bond the electrodes to the corresponding conductive portions, thereby electrically connecting the electrodes to the corresponding conductive portions; and
   a removal step: removing the heat conductive substrate.

8. The method of claim 6, wherein before the align-press step, an ACF is disposed on the corresponding conductive portions, so that the ACF is located between the electrodes and the corresponding conductive portions, and the method of ACF bonding comprises steps of:
   a heating step: heating the heat conductive substrate for transmitting heat to the electrodes;
   a bonding step: utilizing the heat transmitted to the electrodes to bond the electrodes to the corresponding conductive portions through the ACF, thereby electrically connecting the electrodes to the corresponding conductive portions; and
   a removal step: removing the heat conductive substrate.

9. The method of claim 6, wherein before the align-press step, an ACF is disposed on the corresponding conductive portions, so that the ACF is located between the electrodes and the corresponding conductive portions, and the method of ACF bonding comprises steps of:
   a removal step: removing the heat conductive substrate, so that the optoelectronic semiconductor components are adhered to the ACF;
   a heat-press step: heating and pressing the optoelectronic semiconductor components; and
   a bonding step: utilizing the heat transmitted to the electrodes to bond the electrodes to the corresponding conductive portions through the ACF, thereby electrically connecting the electrodes to the corresponding conductive portions.

10. The method of claim 6, wherein the laser bonding comprises steps of:
    an irradiating step: providing a laser to irradiate a press interface between the electrodes and the corresponding conductive portions from one side of the target substrate away from the optoelectronic semiconductor stamp;
    a bonding step: utilizing energy of the laser to melt and bond the electrodes to the corresponding conductive portions, thereby electrically connecting the electrodes to the corresponding conductive portions; and
    a removal step: removing the heat conductive substrate.

11. The method of claim 1, wherein the optoelectronic semiconductor components on the heat conductive substrate are arranged in a polygon.

12. The method of claim 1, wherein the heat conductive substrate comprises a heat conductive base and a buffer layer, and the buffer layer is disposed on the heat conductive base.

13. The method of claim 12, wherein the optoelectronic semiconductor components are adhered to the heat conductive base through the buffer layer, and the optoelectronic semiconductor components are separately disposed on the heat conductive substrate.

14. The method of claim 12, wherein a thermal conductivity of the heat conductive substrate or the heat conductive base is greater than 1 W/mK.

15. The method of claim 1, wherein the optoelectronic semiconductor device is a LED display device, a light sensing device, or a laser array.

* * * * *